(12) United States Patent
Hirota et al.

(10) Patent No.: US 7,420,857 B2
(45) Date of Patent: Sep. 2, 2008

(54) SEMICONDUCTOR INTEGRATED CIRCUIT AND LEAK CURRENT REDUCING METHOD

(75) Inventors: Makoto Hirota, Saitama (JP); Hidekazu Kikuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 139 days.

(21) Appl. No.: 11/546,955

(22) Filed: Oct. 13, 2006

(65) Prior Publication Data

US 2007/0097756 A1 May 3, 2007

(30) Foreign Application Priority Data

Oct. 28, 2005 (JP) ............. 2005-314287

(51) Int. Cl.
*G11C 11/34* (2006.01)
(52) U.S. Cl. .................. 365/189.09; 365/229
(58) Field of Classification Search ............ 365/189.09, 365/229, 154
See application file for complete search history.

(56) References Cited

U.S. PATENT DOCUMENTS

| | | | |
|---|---|---|---|
| 5,592,010 A | 1/1997 | Kakumu et al. | |
| 6,181,608 B1* | 1/2001 | Keshavarzi et al. | 365/188 |
| 6,285,213 B1 | 9/2001 | Makino | |
| 7,187,596 B2* | 3/2007 | Yamauchi | 365/189.09 |
| 2004/0125681 A1 | 7/2004 | Yamaoka et al. | |
| 2004/0190351 A1* | 9/2004 | Fujimoto | 365/189.07 |

FOREIGN PATENT DOCUMENTS

| | | |
|---|---|---|
| JP | 06-53496 | 2/1994 |
| JP | 07-212218 | 8/1995 |
| JP | 11-214962 | 8/1999 |
| JP | 2004-206745 | 7/2004 |

* cited by examiner

*Primary Examiner*—Vu A Le
(74) *Attorney, Agent, or Firm*—Studebaker & Brackett PC; Donald R. Studebaker

(57) ABSTRACT

The present invention provides a semiconductor integrated circuit device which includes at least an SRAM memory cell array comprising a plurality of memory cells each constituted of a circuit including load MOS transistors, drive MOS transistors and transfer MOS transistors, a substrate bias generating circuit which is electrically connected to the load MOS transistors and supplies a substrate potential to the load MOS transistors during at least operation and standby, and a source bias generating circuit which is electrically connected to the drive MOS transistors and supplies a source potential to the drive MOS transistors at standby. It is possible to reduce a leak current in an SRAM memory cell during both operation and standby and reduce current consumption.

25 Claims, 15 Drawing Sheets

SEMICONDUCTOR INTEGRATED CIRCUIT AND LEAK CURRENT REDUCING METHOD

BACKGROUND OF THE INVENTION

1. Field of the Invention

The present invention relates to a semiconductor integrated circuit and a leak current reducing method, and particularly to a semiconductor integrated circuit having a circuit configuration effective in reducing a leak current consumed or used up by an SRAM memory circuit in a system LSI including the SRAM memory circuit, and a leak current reducing method.

This application is counterpart of Japanese patent application, Ser. No. 314287/2005, filed Oct. 28, 2005, the subject matter of which is incorporated herein by reference.

2. Description of the Related Art

With the proliferation of portable devices, there has recently been a demand for a reduction in power consumption of a semiconductor integrated circuit device more than ever before. Particularly, in a system LSI that combines various functional blocks within one chip, an SRAM realized by the same process as a logic system is configured as an important functional block which influences the performance of the system LSI. However, high integration of the SRAM mounted in the system LSI and an increase in capacity thereof have been advanced with process miniaturization. In order to achieve low power consumption of the system LSI, the reduction in power consumption of the SRAM increases in importance.

On the other hand, as the process miniaturization advances, a reduction in power supply voltage is being brought forward. When the power supply voltage is lowered, the operating speed of a MOS transistor becomes slow. As a countermeasure to avoid it, there is known a method for reducing the threshold voltage of the MOS transistor. However, a problem arises in that when the threshold voltage is lowered, a leak current at the time that the MOS transistor is off increases. The SRAM is made up of a memory cell array section for holding data, an external circuit and a peripheral circuit that performs swapping with the data, and has two operating states of an operating state and a standby state. In the standby state in which data of each memory cell is being held without performing write and read operations, only a leak current flows through the peripheral circuit and the memory cell, whereas in the operating state in which the write and read operations are performed, a charge/discharge current generated when load capacitance of each node in the SRAM is charged/discharged, and a through current generated upon switching of each individual MOS transistor constituting the SRAM flow as well as the leak current. As a proportion of current consumption in the SRAM, the charge/discharge current at or during operation has mainly been used. However, the power supply voltage is further reduced with advances in miniaturization from this time forward and the threshold voltage is also reduced. A rapid increase in leak current due to this yields a problem that the current consumption of the SRAM is greatly increased inclusive of during-operation as well as at-standby.

As a conventional method for reducing power consumption of a logic circuit, there has been disclosed in a patent document 1 (Japanese Laid-Open Patent Application No. Hei 6(1994)-53496), a method for mounting a substrate bias circuit and controlling a substrate potential of each MOS transistor by a substrate bias generating circuit at standby to make its threshold voltage higher than during operation, thereby reducing a leak current at standby.

As a method for bringing an SRAM circuit to low power consumption, there has been disclosed in a patent document 2 (Japanese Laid-Open Patent Application No. 2004-206745), a method for cutting off or interrupting a source potential of each drive NMOS transistor in an SRAM memory cell from a ground power supply by means of a switch at standby and thereafter setting the source potential to an intermediate voltage between the ground power supply and a power supply voltage by a source potential control circuit comprised of a diode and a resistor, thereby reducing a leak current of each memory cell at standby.

However, the above conventional configuration is the method for increasing the threshold voltage of each MOS transistor only at standby to thereby reduce the leak current. A problem arises in that the leak current during operation cannot be reduced. In the case of the method for controlling the substrate potential, a MOS semiconductor integrated circuit normally takes a vertical-stack configuration in which the drains of PMOS and NMOS transistors are connected to each other as in CMOS inverters. Therefore, it is not possible to desire a large reduction in leak current unless a substrate potential is applied to both NMOS and PMOS transistors to control both threshold voltages.

A typical SRAM memory cell comprises six MOS transistors. Described specifically, the SRAM memory cell is constituted of two load PMOS transistors, two drive NMOS transistors and two transfer NMOS transistors. Since the NMOS transistors are in majority in number, leak current components due to the NMOS transistors, which are assumed in the total leak current of the memory cell, increase. Therefore, in the case where a substrate bias control method is used, there is a need to fix a source potential Vsn for each NMOS transistor to a ground power supply and control a substrate potential Vbb for the purpose of a reduction in the leak current of the SRAM memory cell. However, in order to supply a potential different from the source potential to a substrate potential Vbb of a specific NMOS transistor in a semiconductor of a P-type substrate, a process for a triple well structure is necessary. It goes increase in process cost as compared with a generally-used signal well structure or twin well structure. As to a substrate potential Vpp for each PMOS transistor, there is no need to use the process for the triple well structure because a substrate for each PMOS transistor is normally connected to an NWELL and can be separated from the P-type semiconductor substrate to which the source potential is connected.

On the other hand, in the case of a method for controlling a source potential Vsn of each drive NMOS transistor, a substrate potential Vbb for the NMOS transistor is set as a ground power supply and a source potential Vsn is set higher than the ground power supply at standby. Thus, a reduction in leak current by a reverse bias effect of a gate-to-source voltage of each transfer NMOS transistor and voltage reduction effects of a drain-to-source voltage of each transfer NMOS transistor, a drain-to-source voltage of each drive NMOS transistor and a drain-to-source voltage of each load PMOS transistor is expected as well as a reduction in leak current of each of the drive and transfer NMOS transistors by a substrate bias effect. However, as compared with the reduction in leak of each of the drive and transfer NMOS transistors, the leak current flowing through the load PMOS transistors is low in reduction effect. Therefore, a problem arises in that a large reduction in leak current over the entire memory cell cannot be anticipated. Although there has been disclosed, as its countermeasure, a method for fabricating the load PMOS transistors by transistors each having a high threshold voltage in advance, there is a need to adopt a Multi-Vt process having plural threshold voltages for an internal logic circuit, and correspondingly process cost becomes high.

As a method for biasing a source potential of each drive NMOS transistor, there has been disclosed one in which a MOS resistor and a MOS diode are connected in parallel. However, a problem arises in that since the voltage value of a source bias is restricted by the threshold voltage of the MOS transistor, the source bias voltage value is susceptible to a process variation, a power supply voltage and temperatures and is apt to influence the effect of reducing a leak current. Since there is, in particular, a tendency that as miniaturization advances, a process variation in threshold voltage becomes large, the source bias voltage value exerts a greater influence on a leak reducing effect. In addition, a problem arises in that since the source bias voltage value is determined according to the balance between the threshold voltage of the MOS transistor and the resistance of the MOS transistor, and its value depends upon a leak current that flows through the SRAM memory cell at standby, it is difficult to set the source bias voltage value to an arbitrary value.

Further, the memory cell has the lowest operating voltage necessary to hold data at standby. While the SRAM operates in an operating voltage range higher than the lowest operating voltage and lower than the maximum power supply voltage of an SRAM power supply, the present operating voltage range becomes narrower as a reduction in power supply voltage advances with miniaturization. Therefore, it is important to generate a bias potential less subject to the process variation and high in accuracy upon ensuring stable retention of data.

SUMMARY OF THE INVENTION

With the foregoing in view, it is therefore an object of the present invention to provide a semiconductor integrated circuit and a leak current reducing method both free from the above problems.

According to a first aspect of the present invention, for attaining the above object, there is provided a semiconductor integrated circuit device comprising at least an SRAM memory cell array comprising a plurality memory cells each constituted of a circuit including load MOS transistors, drive MOS transistors and transfer MOS transistors, and a substrate bias generating circuit which is electrically connected to the load MOS transistors and supplies a substrate potential to the load MOS transistors during at least operation and standby in such a manner that absolute values of threshold voltages of the load MOS transistors increase.

According to a second aspect of the present invention, for attaining the above object, there is provided a leak current reducing method for an SRAM memory cell, comprising the steps of generating a first substrate potential for increasing absolute values of threshold voltages of load MOS transistors included in the SRAM memory cell, and supplying the first substrate potential to the load MOS transistors during at least operation and standby.

According to the present invention, the substrate potential of the SRAM memory cell is always applied by the substrate bias generating circuit during both operation and standby. It is therefore possible to reduce a leak current in the SRAM memory cell during both operation and standby and thereby reduce current consumption.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

First Preferred Embodiment

Figure 1:
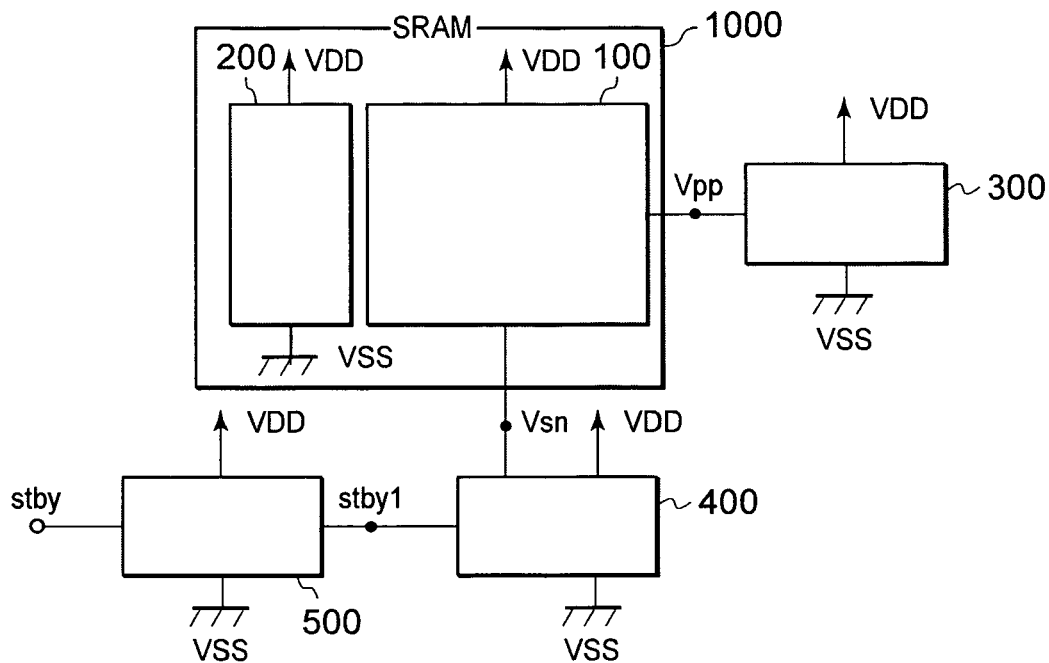
FIG. 1 is a block diagram showing a configuration of a semiconductor integrated circuit according to a first embodiment of the present invention.
Figure 2:
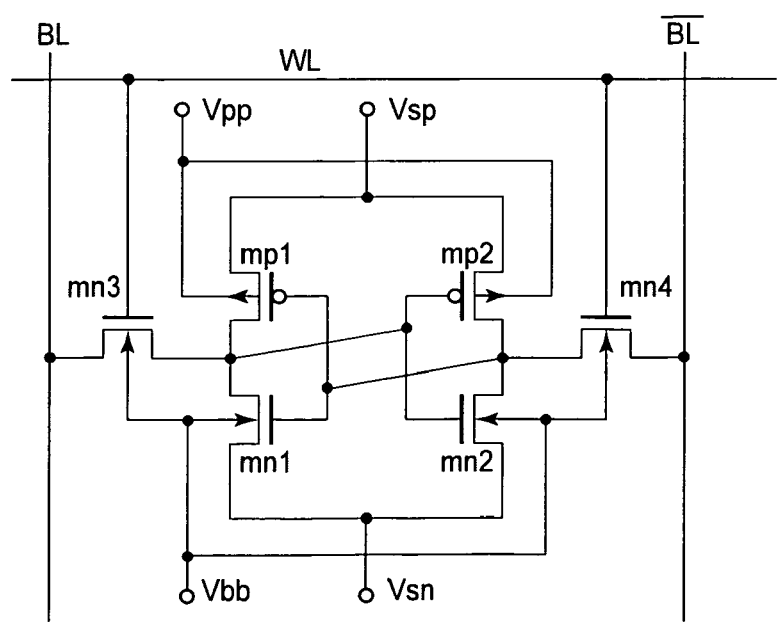
FIG. 2 is an equivalent circuit diagram illustrating a circuit configuration of a memory cell shown in FIG. 1.
Figure 3:
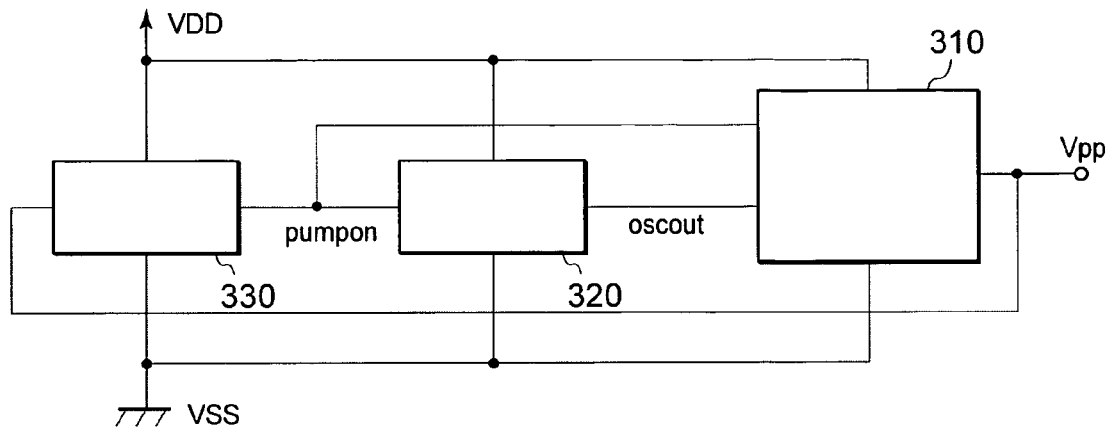
FIG. 3 is a block diagram depicting a configuration of a substrate bias generating circuit shown in FIG. 1.
Figure 4:
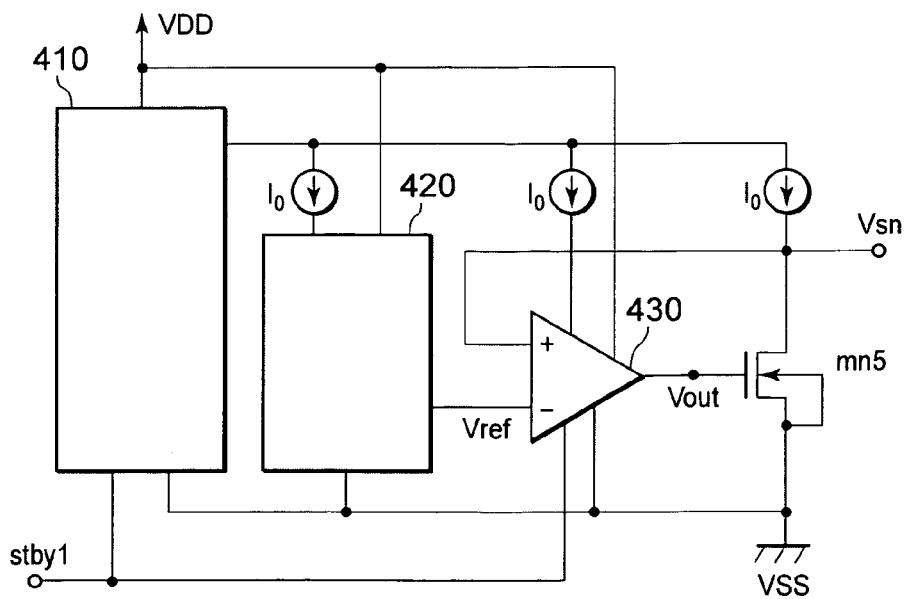
FIG. 4 is a circuit diagram showing a configuration of a regulator circuit that constitutes a source bias generating circuit shown in FIG. 1.
Figure 5:
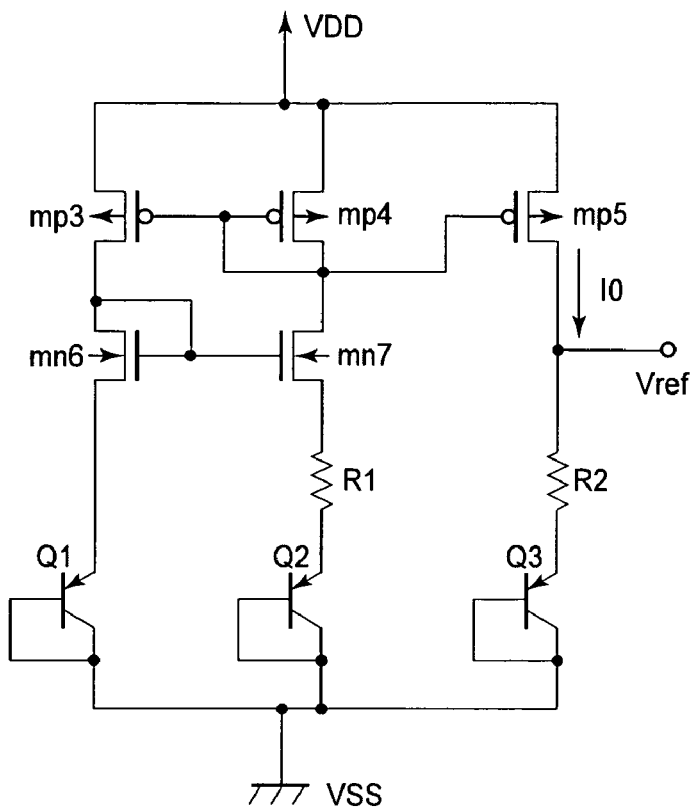
FIG. 5 is an equivalent circuit diagram illustrating a configuration of a bandgap reference voltage circuit that constitutes a reference voltage circuit shown in FIG. 4.
Figure 6:
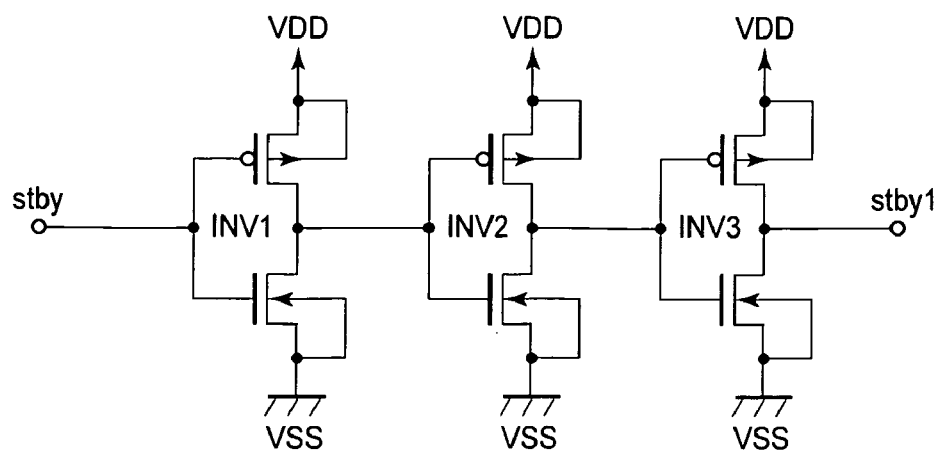
FIG. 6 is an equivalent circuit diagram showing a configuration of a standby control circuit shown in FIG. 1.
Figure 7:
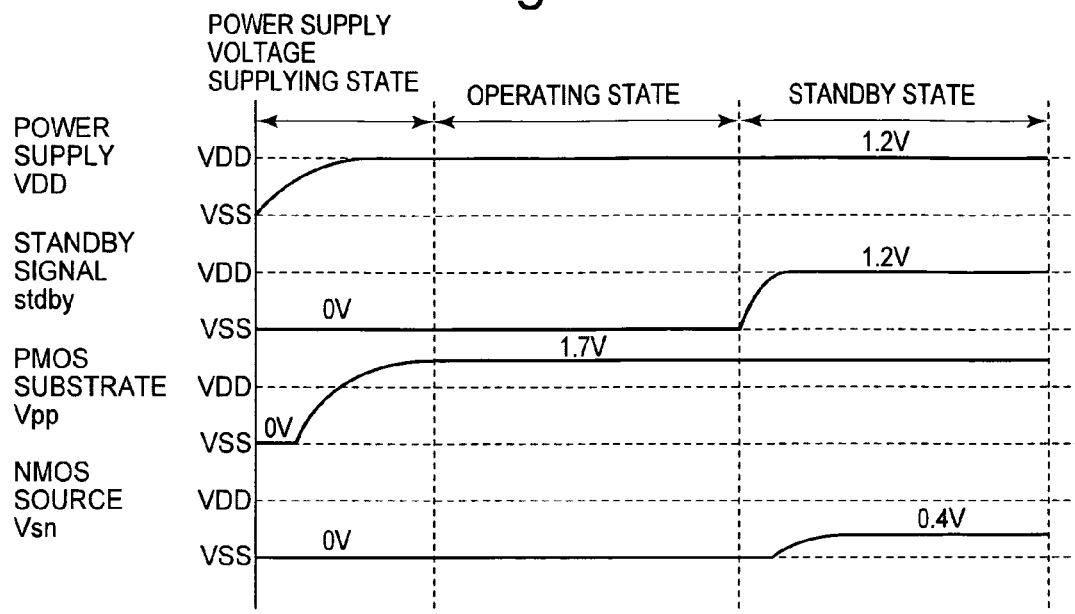
FIG. 7 is a voltage waveform diagram illustrating the operation of the semiconductor integrated circuit shown in FIG. 1.
Figure 8:
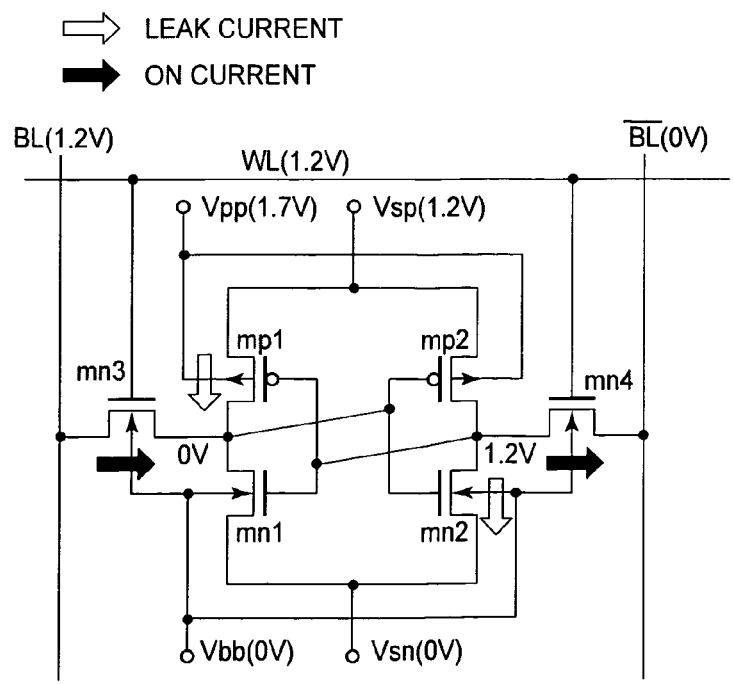
FIG. 8 is a diagram showing a leak current and an on current at a write operation of the memory cell shown in FIG. 2.
Figure 9:
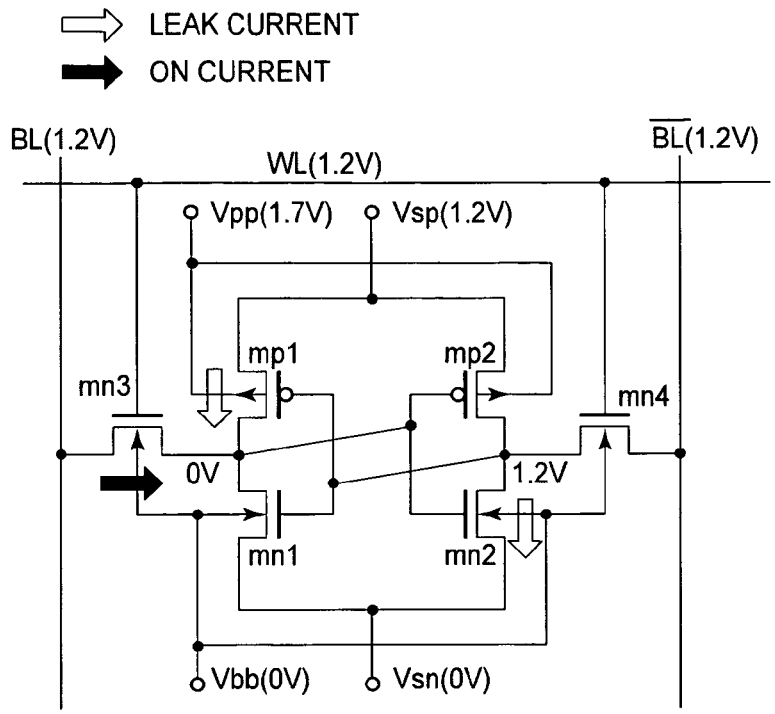
FIG. 9 is a diagram depicting a leak current and an on current at a read operation of the memory cell shown in FIG. 2.
Figure 10:
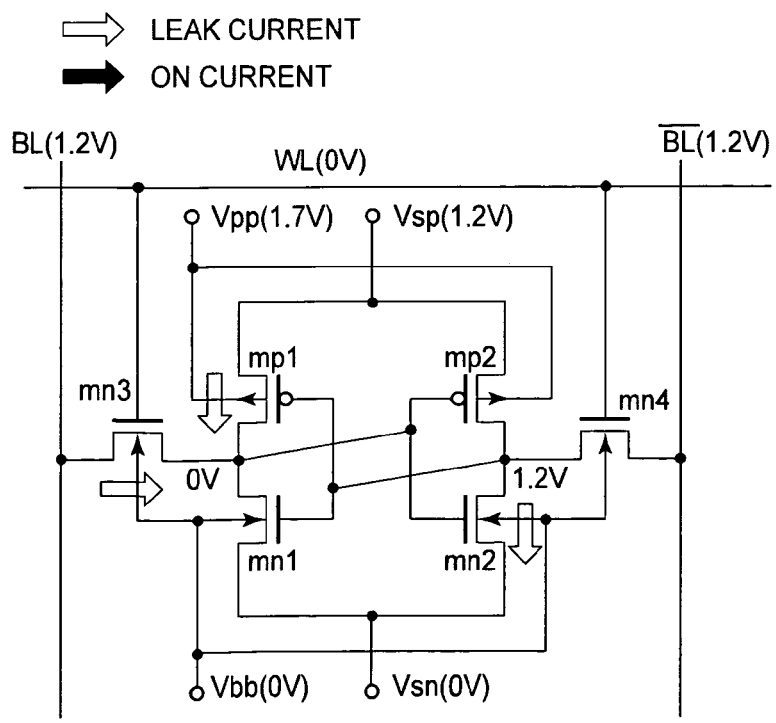
FIG. 10 is a diagram showing a leak current when the memory cell shown in FIG. 2 operates and both writing and reading are not performed.
Figure 11:
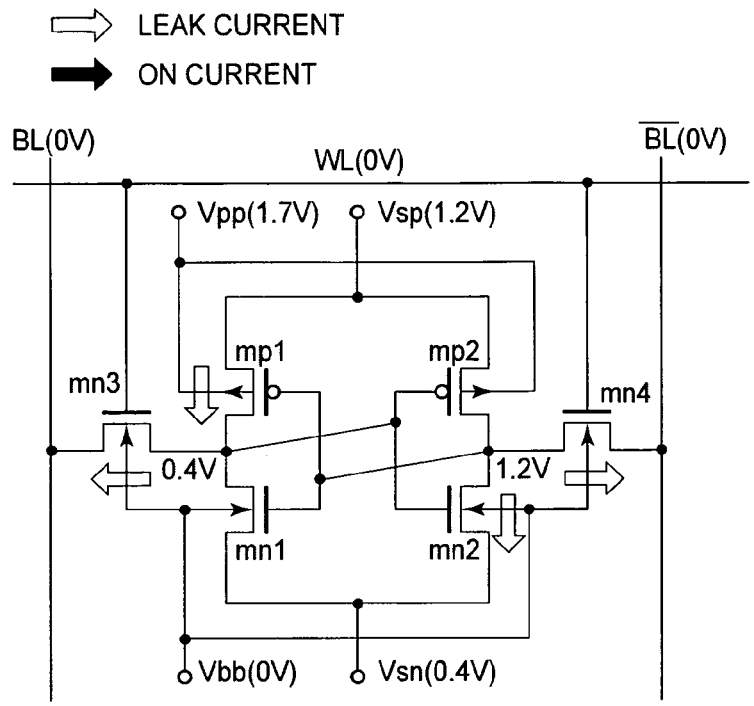
FIG. 11 is a diagram illustrating a leak current at standby of the memory cell shown in FIG. 2.

A first embodiment of the present invention provides a semiconductor integrated circuit effective in reducing a leak current in each SRAM memory cell and reducing current consumption. FIG. 1 is a block diagram showing a configuration of a semiconductor integrated circuit according to a first embodiment of the present invention. FIG. 2 is an equivalent circuit diagram illustrating a circuit configuration of a memory cell shown in FIG. 1. FIG. 3 is a block diagram depicting a configuration of a substrate bias generating circuit shown in FIG. 1. FIG. 4 is a circuit diagram showing a configuration of a regulator circuit that constitutes a source bias generating circuit shown in FIG. 1. FIG. 5 is an equivalent circuit diagram illustrating a configuration of a bandgap reference voltage circuit that constitutes a reference voltage circuit shown in FIG. 4. FIG. 6 is an equivalent circuit diagram showing a configuration of a standby control circuit shown in FIG. 1. FIG. 7 is a voltage waveform diagram illustrating the operation of the semiconductor integrated circuit shown in FIG. 1. FIG. 8 is a diagram showing a leak current and an on current at a write operation of the memory cell shown in FIG. 2. FIG. 9 is a diagram depicting a leak current and an on current at a read operation of the memory cell shown in FIG. 2. FIG. 10 is a diagram showing a leak current when the memory cell shown in FIG. 2 operates and both writing and reading are not performed. FIG. 11 is a diagram illustrating a leak current at standby of the memory cell shown in FIG. 2.

(Circuit Configuration)

As shown in FIG. 1, the semiconductor integrated circuit according to the first embodiment of the present invention includes a SRAM 1000, a substrate bias generating circuit 300, and a source bias generating circuit 400, a standby control circuit 500. The SRAM 1000 further includes a memory cell array 100 and a peripheral circuit 200. The memory cell array 100 can be constituted of a plurality of word lines WL, a plurality of bit line pairs BL and /BL, and a two-dimensional matrix array having a plurality of SRAM cells. The respective SRAM cells are electrically connected to the plurality of word lines WL and the plurality of bit line pairs, i.e., the non-inversion bit lines BL and the inversion bit lines /BL.

As shown in FIG. 2, each of the SRAM cells can be constituted of six MOS transistors. Described specifically, each SRAM cell includes first and second load PMOS transistors mp1 and mp2, first and second drive NMOS transistors mn1 and mn2, first and second transfer NMOS transistors mn3 and mn4, a first source bias potential supply line Vsp, and a second source bias potential supply line Vsn.

The first load PMOS transistor mp1 and the first drive NMOS transistor mn1 are connected in series between the first source bias potential supply line Vsp and the second source bias potential supply line Vsn. The second load PMOS transistor mp2 and the second drive NMOS transistor mn2 are connected in series between the first source bias potential supply line Vsp and the second source bias potential supply line Vsn.

The source of the first load PMOS transistor mp1 is connected to the first source bias potential supply line Vsp. The drain of the first load PMOS transistor mp1 is connected to the drain of the first drive NMOS transistor mn1 and to the drain of the first transfer NMOS transistor mn3. Further, the drain of the first load PMOS transistor mp1 is connected to the gate of the second load PMOS transistor mp2 and the gate of the second drive NMOS transistor mn2. The source of the first drive NMOS transistor mn1 is connected to the second source bias potential supply line Vsn.

The source of the second load PMOS transistor mp2 is connected to the first source bias potential supply line Vsp. The drain of the second load PMOS transistor mp2 is connected to the drain of the second drive NMOS transistor mn2 and to the drain of the second transfer NMOS transistor mn4. Further, the drain of the second load PMOS transistor mp2 is connected to the gate of the first load PMOS transistor mp1 and the gate of the first drive NMOS transistor mn1. The source of the second drive NMOS transistor mn2 is connected to the second source bias potential supply line Vsn.

The drain of the first transfer NMOS transistor mn3 is connected to the drain of the first load PMOS transistor mp1, the drain of the first drive NMOS transistor nm1, the gate of the second load PMOS transistor mp2, and the gate of the second drive NMOS transistor mn2. The source of the first transfer NMOS transistor mn3 is connected to its corresponding non-inversion bit line BL. The gate of the first transfer NMOS transistor mn3 is connected to its corresponding word line WL.

The drain of the second transfer NMOS transistor mn4 is connected to the drain of the second load PMOS transistor mp2, the drain of the second drive NMOS transistor mn2, the gate of the first load PMOS transistor mp1, and the gate of the first drive NMOS transistor mn1. The source of the second transfer NMOS transistor mn4 is connected to its corresponding inversion bit line /BL. The gate of the second transfer NMOS transistor mn4 is connected to its corresponding word line WL.

A first substrate bias potential supply line Vpp is connected to a substrate used for the first and second load PMOS transistors mp1 and mp2. A second substrate bias potential supply line Vbb is connected to a substrate used for the first and second drive NMOS transistors mn1 and mn2 and a substrate used for the first and second transfer NMOS transistors mn3 and mn4. In other words, the substrate for the first and second load PMOS transistors mp1 and mp2 are supplied with a first substrate bias potential Vpp. The substrate for the first and second drive NMOS transistors mn1 and mn2 and the substrate for the first and second transfer NMOS transistors mn3 and mn4 are supplied with a second substrate bias potential Vbb.

Referring to FIG. 1 again, the substrate bias generating circuit 300 is connected to the substrate for the first and second load PMOS transistors mp1 and mp2 via the first substrate bias potential supply line Vpp. The source bias generating circuit 400 is connected to the first and second drive NMOS transistors mn1 and mn2 via the second source bias potential supply line Vsn.

That is, the substrate bias generating circuit 300 is connected to the memory cell array 100 and supplies the first substrate bias potential Vpp to the first and second load PMOS transistors mp1 and mp2. The source bias generating circuit 400 is connected to the memory cell array 100 and supplies a second source bias potential Vsn to the first and second drive NMOS transistors mn1 and mn2. The standby control circuit 500 is connected to the source bias generating circuit 400 and supplies a standby signal stby1 to the source bias generating circuit 400, based on a standby signal stby. The standby signal stby1 is a signal for performing switching between an operating state and a standby state of the SRAM 1000. The peripheral circuit 200 is connected to a power supply VDD and a ground power supply VSS but not to the substrate bias generating circuit 300 and the source bias generating circuit 400.

When the SRAM 1000 is in the operating state, the standby signal stby1 corresponding to a control signal switched upon operation is supplied from the standby control circuit 500 to the source bias generating circuit 400, so that the source bias generating circuit 400 is brought into a standby state, thereby supplying the ground power supply VSS to the second source bias potential supply line Vsn. That is, the second source bias potential supply line Vsn is connected to the ground power supply VSS at low impedance.

When the SRAM 1000 is in the standby state, the standby signal stby1 corresponding to a control signal switched upon its standby is supplied from the standby control circuit 500 to the source bias generating circuit 400, so that the source bias generating circuit 400 is brought into an operating state, thereby supplying a constant potential higher than the ground power supply VSS to the second source bias potential supply line Vsn. That is, the second source bias potential supply line Vsn is maintained at the constant potential higher than the ground power supply VSS. This constant potential is set to such a value that the SRAM memory cell ensures the lowest operating voltage necessary for holding data and a leak current at standby can be reduced as much as possible.

After the power supply VDD has risen, the substrate bias generating circuit 300 always generates a first substrate bias potential Vpp higher than the power supply VDD regardless of the standby state and operating state of the SRAM 1000 and supplies the generated first substrate bias potential Vpp to the substrate for the first and second load PMOS transistors mp1 and mp2 of the memory cell array 100. Thus, the substrate for the first and second load PMOS transistors mp1 and mp2 constituting the PMOS transistors of each memory cell is held at a constant potential Vpp higher than the power supply VDD. This constant potential Vpp is set to such a value as to suppress current consumption of the substrate bias generating circuit 400 and to enable a reduction in leak current as much as possible. Described specifically, the optimum Vpp value is determined from simulation or the result evaluated by actual silicon.

A specific circuit configuration of the substrate bias generating circuit 300 shown in FIG. 1 will be explained with reference to FIG. 3. The substrate bias generating circuit 300 can be constituted of a charge pump circuit 310, a ring oscillator 320 and a sensor circuit 330. The present invention is not necessarily limited to it. The input of the charge pump circuit 310 is electrically connected to the output of the ring oscillator 320 and the output of the sensor circuit 330. The charge pump circuit 310 outputs a first substrate bias voltage Vpp, based on a signal outputted from the ring oscillator 320 and a signal outputted from the sensor circuit 330. The signal outputted from the ring oscillator 320 is inputted to the charge pump circuit 310 due to the rising edge of the power supply VDD. The charge pump circuit 310 generates a first substrate bias potential Vpp large than the power supply VDD by its charge pump operation. The input of the sensor circuit 330 is electrically connected to the output of the charge pump circuit 310. The sensor circuit 330 is operated so as to maintain the first substrate bias potential Vpp outputted from the charge pump circuit 310 to within a value or range set in advance. Described specifically, when the sensor circuit 330 detects that the first substrate bias potential Vpp has exceeded the upper limit value of the pre-set value or range, the operation of the charge pump circuit 310 and the operation of the ring oscillator 320 are stopped. After their shutdown, the first substrate bias potential Vpp is gradually lowered by a substrate leak current that flows through the substrate for the first and second load PMOS transistors mp1 and mp2 in each memory cell electrically connected to the substrate bias generating circuit 300. When the sensor circuit 330 detects that the first substrate bias potential Vpp has been brought to within the pre-set value or range, the sensor circuit 330 allows the operation of the charge pump 310 and the operation of the ring oscillator 320 to be started. As a result, the input of the sensor circuit 330 is electrically connected to the output of the charge pump circuit 310 so that the first substrate bias potential Vpp outputted from the charge pump circuit 310 is held within the pre-set value or range.

A circuit configuration of the source bias generating circuit 400 shown in FIG. 1 will be explained with reference to FIG. 4. Although the source bias generating circuit 400 can also be constituted of a regulator circuit suitably, the present invention is not necessarily limited to it. Described specifically, the source bias generating circuit 400 comprised of the regulator circuit includes a constant current circuit 410, a reference voltage circuit 420, an amplifier circuit 430 and an NMOS transistor mn5 as shown in FIG. 4. The gate of the NMOS transistor mn5 is electrically connected to the output of the amplifier circuit 430. The source of the NMOS transistor mn5 is connected to the ground power supply VSS. The drain of the NMOS transistor mn5 is connected to the second source bias potential Vsn corresponding to the output of the source bias generating circuit 400. The constant current circuit 410 is electrically connected to the standby control circuit 500 shown in FIG. 1 and to the second source bias potential Vsn shown in FIG. 4. The constant current circuit 410 takes an operating state or standby state in accordance with the standby signal stby1 outputted from the standby control circuit 500. Described specifically, when the constant current circuit 410 receives therein the standby signal stby1 indicative of the standby state of the SRAM 1000, the constant current circuit 410 is brought to an operating state so that a constant current $I_0$ is outputted therefrom, which in turn is supplied to the reference voltage circuit 420, the amplifier circuit 430 and the NMOS transistor mn5 as a bias current. A reference voltage Vref outputted from the reference voltage circuit 420 is inputted to a — input terminal of the amplifier circuit 430. On the other hand, the second source bias potential Vsn used as the output of the source bias generating circuit 400 is inputted to a + input terminal.

When the current that flows into the second source bias potential supply line Vsn increases and the second source bias potential Vsn rises as compared with the reference voltage Vref, the amplifier circuit 430 raises its output Vout to decrease output resistance of the NMOS transistor mn5, whereby the rise in the second source bias potential Vsn is suppressed. This is similar even where the second source bias potential Vsn decreases. With this feedback operation, the second source bias potential Vsn is maintained at the same potential as the reference voltage Vref. When the SRAM 1000 is in the operating state, the source bias generating circuit 400 is brought into the standby state, so that the bias current outputted from the constant current circuit 410 becomes approximately zero. Thus, current consumption of the source bias generating circuit 400 results in a very small leak current alone. A potential at the gate of the NMOS transistor mn5 that constitutes a final stage of the source bias generating circuit 400 is brought to a power supply VDD level to turn on the NMOS transistor mn5, so that the level of the second source bias potential Vsn is held at a ground power supply level. Since the second source bias potential Vsn can be connected to the ground power supply at the lowest possible impedance by setting the width of the gate of the NMOS transistor mn5 as large as possible, no influence is exerted on the operating characteristics of the SRAM 1000.

The constant current circuit 410 and the reference voltage circuit 420 lying in the regulator circuit constituting the source bias generating circuit 400 can be realized using the known bandgap reference voltage circuit. When the bandgap reference voltage circuit is used, the constant current circuit 410 and the reference voltage circuit 420 are capable of obtaining stable output characteristics less subject to variations due to a process, a power supply voltage and temperatures. Thus, the source bias generating circuit 400 is capable of generating the second source bias potential Vsn resistant to the influence with the process, power supply voltage and temperatures.

A configuration of the bandgap reference voltage circuit will be described below with reference to FIG. 5. The bandgap reference voltage circuit can be constituted of PMOS transistors mp3, mp4 and mp5, NMOS transistors mn6 and mn7, PNP bipolar transistors Q1, Q2 and Q3, and resistive elements R1 and R2. The sources of the PMOS transistors mp3, mp4 and mp5 are connected to their corresponding power supply VDD. The gates of the PMOS transistors mp3, mp4 and mp5 are connected to their corresponding drain of the PMOS transistor mp4. The drain of the PMOS transistor mp3 is connected to the drain and gate of the NMOS transistor mn6. The drain of the PMOS transistor mp4 is connected to the drain of the NMOS transistor mn7. The drain of the PMOS transistor mp5 is connected to its corresponding reference voltage Vref corresponding to the output of the bandgap reference voltage circuit and to the emitter of the PNP bipolar transistor Q3 via the resistive element R2. The gate of the NMOS transistor mn6 is connected to the gate of the NMOS transistor mn7. The source of the NMOS transistor mn6 is connected to the emitter of the PNP bipolar transistor Q1. The source of the NMOS transistor mn7 is connected to the emitter of the PNP bipolar transistor Q2 via the resistive element R1. The base and collector of the PNP bipolar transistor Q1 are connected to each other and connected to the ground power supply VSS. The base and collector of the PNP bipolar transistor Q2 are connected to each other and connected to the ground power supply VSS. The base and collector of the PNP bipolar transistor Q3 are connected to each other and connected to the ground power supply VSS.

A reference voltage Vref independent on the temperature can be generated by suitably adjusting the values of the resistive elements R1 and R2.

A circuit configuration of the standby control circuit 500 shown in FIG. 5 will be explained with reference to FIG. 6. The standby control circuit 500 can be constituted by multi-stage-connecting inverters INV1, INV2 and INV3. The standby control circuit 500 generates a standby signal stby1 used as an inversion or non-inversion logic signal of a standby signal stby for performing switching between the operating state and standby state of the SRAM 1000, which has been outputted from an unillustrated internal logic circuit, and supplies it to the source bias generating circuit 400.

Waveforms of respective nodes in the operating state and standby state of the SRAM 1000 shown in FIG. 1 are shown in FIG. 7. Assume that as examples of respective voltage conditions in FIG. 7, the power supply voltage VDD=1.2V, the first substrate bias potential Vpp=1.7V and the second source bias potential Vsn=0.4V. Due to the rising edge of the power supply voltage VDD as mentioned above, the first substrate bias potential Vpp for the first and second load PMOS transistors mp1 and mp2 of each memory cell rises up to the voltage 1.7V higher than the power supply voltage VDD. Thus, the first substrate bias voltage Vpp is held at 1.7V between the operating state of the SRAM 1000 and its standby state. The second source bias potential Vsn for the first and second drive NMOS transistors mn1 and mn2 of each memory cell is held at the ground power supply 0V during the operating state of the SRAM 1000. When the SRAM 1000 makes transition from the operating state to the standby state, the second source bias potential Vsn rises to 0.4V higher than the ground power supply and is held at 0.4V during the standby state.

(Circuit Operation)

A leak current reducing effect will next be explained. FIGS. 8 through 11 respectively show potential states of respective nodes during or at the operation and standby of each memory cell. Since the potential states of the memory cell during its operation are divided into three states indicative of at-write operation, at-read operation and at-writing/reading-free time, the respective potential states will be shown. In the drawings, white arrows indicate paths through which a transistor's leak current flows, and black arrows indicate paths through which a transistor's on current flows.

Upon the respective operations of FIGS. 8 through 10, paths through which a leak current can flow depending upon the operating state exist in each of the first and second load PMOS transistors mp1 and mp2, the first and second drive NMOS transistors mn1 and mn2 and the first and second transfer NMOS transistors mn3 and mn4. The leak current flows through each of the first and second load PMOS transistors mp1 and mp2 and the first and second drive NMOS transistors mn1 and mn2 under the three operating states of the SRAM 1000, i.e., all of the write operation, the read operation and the operation free of both writing and reading. Since, however, the first substrate bias potential Vpp for the first and second transfer NMOS transistors mn3 and mn4 is biased to about 1.7V and their source potentials are fixed to the power supply voltage VDD=1.2V under the three operating states, a back or reverse bias is applied between the substrate and their sources at 0.5V. Thus, the leak current flowing through each of the first and second load PMOS transistors mp1 and mp2 can be reduced by a substrate bias effect under all of the three states during operation.

At the standby of FIG. 11, paths through which a leak current flows exist in the first and second load PMOS transistors mp1 and mp2, the first and second drive NMOS transistors mn1 and mn2 and the first and second transfer NMOS transistors mn3 and mn4 respectively. The leak current that flows through each of the first and second load PMOS transistors mp1 and mp2 is reduced by the substrate bias effect in a manner similar to during operation. The leak current that flows through each of the first and second drive NMOS transistors mn1 and mn2 is reduced in the following manner. Since the second source bias potential Vsn is biased to about 0.4V and the potential at the substrate for the first and second drive NMOS transistors mn1 and mn2 is fixed to the ground power supply (0V), a backward bias is applied between the substrate and their sources at 0.4V. Thus, the leak current that flows through each of the first and second drive NMOS transistors mn1 and mn2 is reduced by a substrate bias effect.

Likewise, the first and second transfer NMOS transistors mn3 and mn4 are also reduced in leak current by a substrate bias effect. Since, however, a backward bias is applied between the gate and source potentials of the first and second transfer NMOS transistors mn3 and mn4, the leak current that flows through each of the first and second transfer NMOS transistors mn3 and mn4 is greatly reduced by this effect.

It is generally known that a leak current flowing through each transistor is reduced even depending on a reduction in the voltage between its drain and source. The drain-to-source voltage is reduced 0.4V from the power supply voltage VDD 1.2V by a source bias potential and thereby results in 0.8V. Even from this, the leak of each of the first and second load NMOS transistors mp1 and mp2, first and second drive NMOS transistors mn1 and mn2 and first and second transfer NMOS transistors mn3 and mn4 is reduced.

Incidentally, since the peripheral circuit 200 performs a normal operation at both of its operation and standby, no leak reducing effect is produced.

(Advantageous Effects)

According to the first embodiment of the present invention as described above, the leak current that flows through each of the load PMOS transistors constituting each memory cell of the SRAM 1000 can be reduced regardless of during-operation and at-standby. Since the substrate bias in the memory cell controls only the potential of the substrate for the load PMOSs in the memory cell during both the operation and standby, the access speed of the memory is little affected by it during operation. Since the substrate bias for the PMOS transistors alone is controlled, there is no need to provide a process structure of a triple well. Hence the present embodiment can be realized at low cost.

Further, the source potential of each drive NMOS transistor of the memory cell is held at the constant potential higher than the ground power supply at the standby. Thus, the leak current flowing in each of the drive NMOS transistors, transfer NMOS transistors and load PMOS transistors can be greatly reduced by the substrate bias effect, the reverse bias effect of the gate-to-source potential and the voltage reduction effect of the drain-to-source voltage while the data stored in each memory cell is being held. By controlling the second source bias potential Vsn by the output voltage of the regulator circuit constituting the source bias generating circuit 400 without using the diode-connected transistor, the stable source potential less subject to the influences with the process variation, power supply voltage and temperatures can be supplied and hence a predetermined leak-current reducing effect can be expected. Controlling the reference voltage Vref of the regulator circuit constituting the source bias generating circuit 400 makes it possible to easily realize an arbitrary bias voltage. Therefore, a reduction in leak current and stable retention performance of data are made compatible even when a low-voltage trend toward the power supply voltage is advanced.

Second Preferred Embodiment

Figure 12:
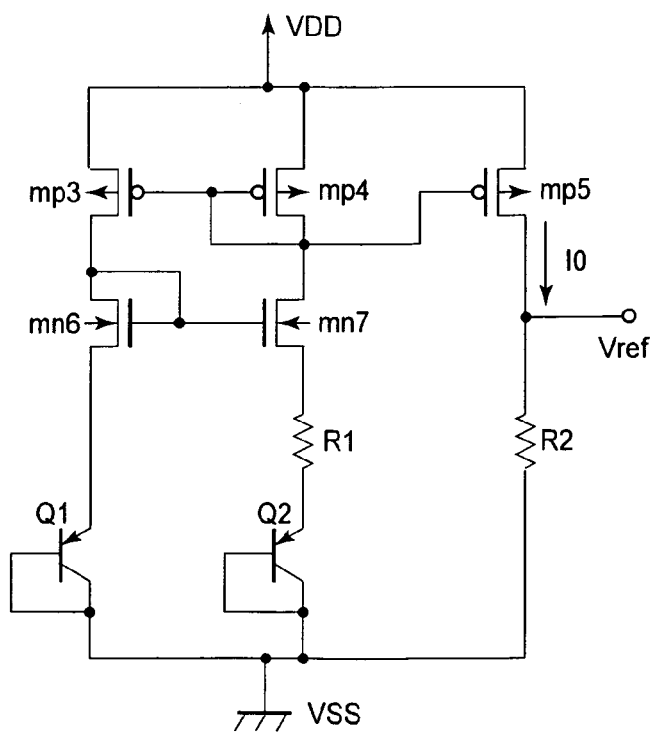
FIG. 12 is an equivalent circuit diagram showing a configuration of a reference voltage circuit having a positive temperature coefficient, which constitutes a reference voltage circuit according to a second embodiment of the present invention.

A second embodiment of the present invention provides a semiconductor integrated circuit effective in reducing a leak current in an SRAM memory cell and reducing current consumption. FIG. 12 is an equivalent circuit diagram showing a configuration of a reference voltage circuit having a positive temperature coefficient, which constitutes a reference voltage circuit according to the second embodiment of the present invention.

(Circuit Configuration)

The configuration of the semiconductor integrated circuit according to the second embodiment of the present invention is identical to the configuration of the semiconductor integrated circuit according to the first embodiment except for the circuit configuration of the reference voltage circuit 420 shown in FIG. 4. Therefore, only the circuit configuration of the reference voltage circuit 420 will be explained below with reference to FIG. 12 to avoid dual explanations.

The constant current circuit 410 and reference voltage circuit 420 in the regulator circuit that constitutes the source bias generating circuit 400 can be realized by the known reference voltage circuit having the positive temperature coefficient. When the reference voltage circuit having the positive temperature coefficient is used, the constant current circuit 410 and the reference voltage circuit 420 can obtain output characteristics less subject to variations due to a process and a power supply voltage and having constant positive temperature coefficients. Thus, the source bias generating circuit 400 is capable of generating a second source bias potential Vsn less subject to the influence due to the process and the power supply voltage and having a constant positive temperature coefficient.

The configuration of the reference voltage circuit having the positive temperature coefficient will be described below with reference to FIG. 12. The reference voltage circuit having the positive temperature coefficient can be constituted of PMOS transistors mp3, mp4 and mp5, NMOS transistors mn6 and mn7, PNP bipolar transistors Q1 and Q2, and resistive elements R1 and R2. The sources of the PMOS transistors mp3, mp4 and mp5 are connected to a power supply VDD. The gates of the PMOS transistors mp3, mp4 and mp5 are connected to the drain of the PMOS transistor mp4. The drain of the PMOS transistor mp3 is connected to the drain and gate of the NMOS transistor mn6. The drain of the PMOS transistor mp4 is connected to the drain of the NMOS transistor mn7. The drain of the PMOS transistor mp5 is connected to a reference voltage Vref corresponding to the output of the reference voltage circuit having the positive temperature coefficient and connected to a ground power supply VSS via the resistive element R2. The gate of the NMOS transistor mn6 is connected to the gate of the NMOS transistor mn7. The source of the NMOS transistor mn6 is connected to the emitter of the PNP bipolar transistor Q1. The source of the NMOS transistor mn7 is connected to the emitter of the PNP bipolar transistor Q2 via the resistive element R1. The base and collector of the PNP bipolar transistor Q1 are connected to each other and connected to the ground power supply VSS. The base and collector of the PNP bipolar transistor Q2 are connected to each other and connected to the ground power supply VSS.

That is, the reference voltage circuit shown in FIG. 12 has the same circuit configuration except that the PNP bipolar transistor Q3 is not provided in the reference voltage circuit shown in FIG. 5.

This circuit generally constitutes the reference voltage circuit having the positive temperature coefficient and makes use of the reference voltage Vref. Thus, a regular circuit that generates an output voltage having a constant temperature coefficient without depending upon variations in process and power supply voltage can be realized. Since there is a tendency that a leak current that flowing through each transistor exponentially increases with an increase in temperature, the output voltage of the regulator circuit is lowered, a source bias voltage is reduced and a leak reducing effect is weakened, under the condition that the temperature is low and the leak current of the SRAM 1000 is small. Upon the condition that the temperature is high and the leak current is large, the output voltage of the regulator circuit is rendered high, the source bias potential is made high and the leak reducing effect is enlarged. The regulator circuit having such a temperature correcting effect can be realized using the reference voltage circuit shown in FIG. 12. Changing the configuration of the reference voltage generating circuit makes it also possible to cause the regulator circuit to have a power supply voltage correcting effect which raises a source bias potential when a power supply voltage is high and lowers the source bias potential too when the power supply voltage is low.

(Advantageous Effects)

According to the second embodiment of the present invention as described above, in addition to the effects described in the first embodiment, the output voltage of the regulator circuit constituting the source bias generating circuit 400 is caused to have constant temperature dependence, thereby making it possible to allow the regulator circuit to have such a correcting effect as to generate the source bias voltage dependent upon the size of the leak current at the standby of the SRAM 1000.

Third Preferred Embodiment

Figure 13:
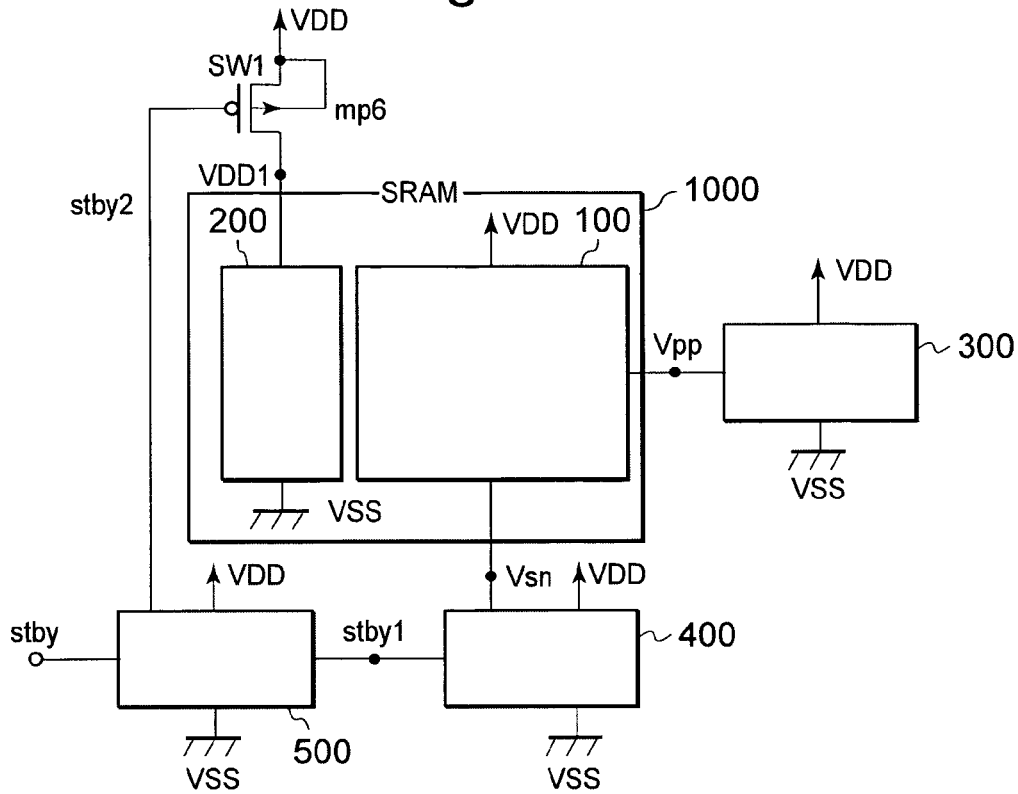
FIG. 13 is a block diagram depicting a circuit configuration of a semiconductor integrated circuit according to a third embodiment of the present invention.

A third embodiment of the present invention provides a semiconductor integrated circuit effective in reducing a leak current in an SRAM memory cell and reducing current consumption. FIG. 13 is a block diagram showing a circuit configuration of the semiconductor integrated circuit according to the third embodiment of the present invention.

(Circuit Configuration)

The configuration of the semiconductor integrated circuit according to the third embodiment of the present invention is identical to the configuration of the semiconductor integrated circuit according to the first embodiment except that a first switching element SW1 shown in FIG. 13 is provided between a power supply VDD and a peripheral circuit 200. Accordingly, only a relationship of circuit connection of the first switching element SW1 will be explained below with reference to FIG. 13 to avoid dual explanations.

The first switching element SW1 is provided between the power supply VDD and the peripheral circuit 200 and cuts off or interrupts the peripheral circuit 200 from the power supply VDD on the basis of a standby signal stby2 corresponding to a second output of a standby control circuit 500. The first switching element SW1 can be constituted of, specifically, a PMOS transistor mp6. The gate of the PMOS transistor mp6 is electrically connected to the standby control circuit 500 and receives therein the standby signal stby2 corresponding to the second output of the standby control circuit 500. The source of the PMOS transistor mp6 is electrically connected to the power supply VDD, whereas the drain of the PMOS transistor mp6 is electrically connected to a virtual power supply VDD1 of the peripheral circuit 200. That is, the PMOS transistor mp6 that constitutes the first switching element SW1 is a switch for turning on/off between the power supply VDD and the virtual power supply VDD1 of the peripheral circuit 200. When it is in an on state, the virtual power supply VDD1 reaches the same potential as the power supply VDD, whereas when it is in an off state, the virtual power supply VDD1 is interrupted from the power supply VDD. The PMOS transistor mp6 that constitutes the first switching element SW1 is set to a gate width made as smaller as possible than the total gate width of the peripheral circuit 200 so as to reduce a leak current at the standby of the peripheral circuit 200 as much as possible upon the off state and minimize an influence exerted on an operating speed of the peripheral circuit 200 upon its operation.

(Circuit Operation)

When the SRAM 1000 is during operation, a standby signal stby2 corresponding to a control signal switched upon operation is outputted from the standby control circuit 500, so that the PMOS transistor mp6 provided between the power supply VDD and the virtual power supply VDD1 of the peripheral circuit 200 is brought to an on state so that the peripheral circuit 200 performs a normal operation.

When the SRAM 1000 is at standby, a standby signal stby2 corresponding to a control signal switched upon standby is outputted from the standby control circuit 500 so that the PMOS transistor mp6 is brought to an off state. Thus, the virtual power supply VDD1 of the peripheral circuit 200 is interrupted from the power supply VDD, so that the total leak current flowing through the peripheral circuit 200 is restricted by a leak current that flows through the PMOS transistor mp6 placed in the off state. Since the gate width of the PMOS transistor mp6 makes use of one sufficiently smaller than the total gate width of transistors that constitute the peripheral circuit 200, the leak current can greatly be reduced.

(Advantageous Effects)

According to the third embodiment of the present invention as described above, in addition to the effects described in the first embodiment, the peripheral circuit 200 is cut off from the power supply VDD by means of the PMOS transistor mp6 that constitutes the first switching element SW1, upon the standby of the SRAM 1000, whereby the leak current flowing through the peripheral circuit 200 can greatly be reduced, thus making it possible to reduce the leak current in each memory cell and reduce current consumption of the entire SRAM 1000.

Fourth Preferred Embodiment

Figure 14:
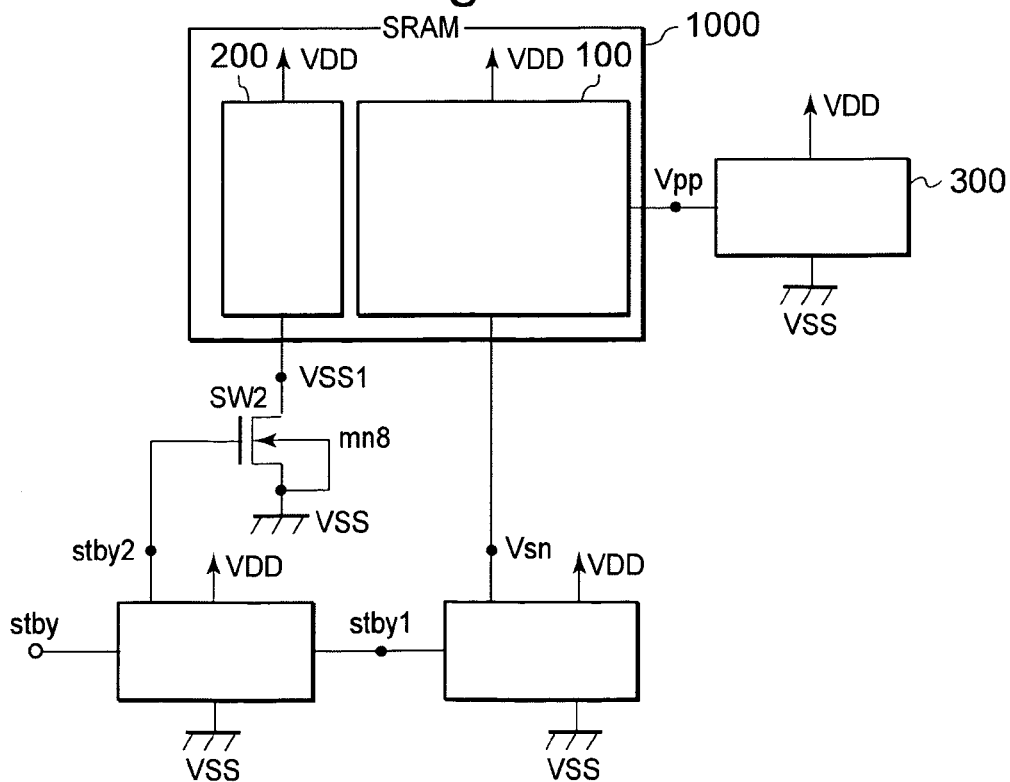
FIG. 14 is a block diagram illustrating a circuit configuration of a semiconductor integrated circuit according to a fourth embodiment of the present invention.

A fourth embodiment of the present invention provides a semiconductor integrated circuit effective in reducing a leak current in an SRAM memory cell and reducing current consumption. FIG. 14 is a block diagram showing a circuit configuration of the semiconductor integrated circuit according to the fourth embodiment of the present invention.

(Circuit Configuration)

The configuration of the semiconductor integrated circuit according to the fourth embodiment of the present invention is identical to the configuration of the semiconductor integrated circuit according to the first embodiment except that a second switching element SW2 shown in FIG. 14 is provided between a ground power supply VSS and a peripheral circuit 200. Thus, only a relationship of circuit connection of the second switching element SW2 will be explained below with reference to FIG. 14 to avoid dual explanations.

The second switching element SW2 is provided between the ground power supply VSS and the peripheral circuit 200 and cuts off or interrupts the peripheral circuit 200 from the ground power supply VSS on the basis of a standby signal stby2 corresponding to a second output of a standby control circuit 500. The second switching element SW2 can be constituted of, specifically, an NMOS transistor mn8. The gate of the NMOS transistor mn8 is electrically connected to the standby control circuit 500 and receives therein the standby signal stby2 corresponding to the second output of the standby control circuit 500. The source of the NMOS transistor mn8 is electrically connected to the ground power supply VSS, whereas the drain of the NMOS transistor mn8 is electrically connected to a virtual ground power supply VSS1 of the peripheral circuit 200. That is, the NMOS transistor mn8 that constitutes the second switching element SW2 is a switch for turning on/off between the ground power supply VSS and the virtual ground power supply VSS1 of the peripheral circuit 200. When it is in an on state, the virtual ground power supply VSS1 reaches the same potential as the ground power supply VSS, whereas when it is in an off state, the virtual ground power supply VSS1 is interrupted from the ground power supply VSS. The NMOS transistor mn8 that constitutes the second switching element SW2 is set to a gate width made as smaller as possible than the total gate width of the peripheral circuit 200 so as to reduce a leak current at the standby of the peripheral circuit 200 as much as possible upon the off state and minimize an influence exerted on an operating speed of the peripheral circuit 200 upon its operation.

(Circuit Operation)

When the SRAM 1000 is during operation, a standby signal stby2 corresponding to a control signal switched upon operation is outputted from the standby control circuit 500, so the NMOS transistor mn8 provided between the ground power supply VSS and the virtual ground power supply VSS1 of the peripheral circuit 200 is brought to an on state, whereby the peripheral circuit 200 performs a normal operation.

When the SRAM 1000 is at standby, a standby signal stby2 corresponding to a control signal switched upon standby is outputted from the standby control circuit 500 so that the NMOS transistor mn8 is brought to an off state. Thus, the virtual ground power supply VSS1 of the peripheral circuit 200 is interrupted from the ground power supply VSS, so that the total leak current flowing through the peripheral circuit 200 is restricted by a leak current that flows through the NMOS transistor mn8 placed in the off state. Since the gate width of the NMOS transistor mn8 makes use of one sufficiently smaller than the total gate width of transistors that constitute the peripheral circuit 200, the leak current can greatly be reduced.

(Advantageous Effects)

According to the fourth embodiment of the present invention as described above, in addition to the effects described in the first embodiment, the peripheral circuit 200 is cut off from the ground power supply VSS by means of the NMOS transistor mn8 that constitutes the second switching element SW2, upon the standby of the SRAM 1000, whereby the leak current flowing through the peripheral circuit 200 can greatly be reduced, thus making it possible to reduce the leak current in each memory cell and reduce current consumption of the entire SRAM 1000. Since current drive capacity of an NMOS transistor is generally higher than that of a PMOS transistor, a layout area can be reduced or cut down by constituting the second switching element SW2 for cutting off the peripheral circuit 200 from the ground power supply VSS by the NMOS transistor.

Fifth Preferred Embodiment

Figure 15:
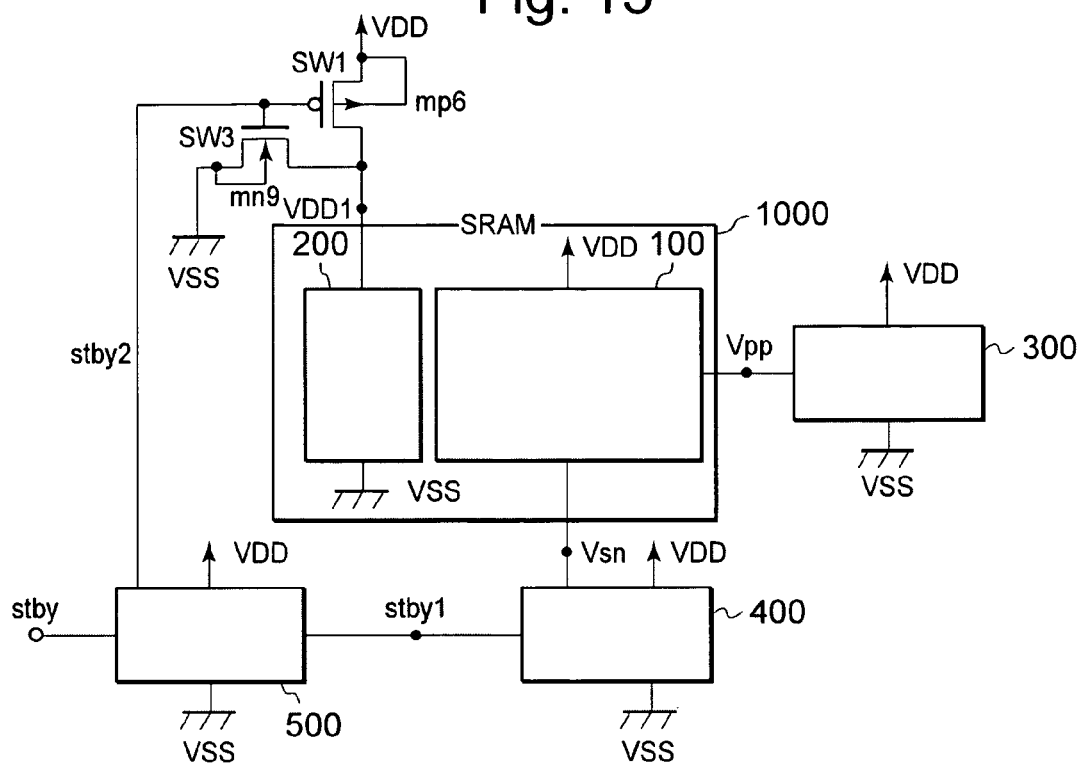
FIG. 15 is a block diagram showing a circuit configuration of a semiconductor integrated circuit according to a fifth embodiment of the present invention.

A fifth embodiment of the present invention provides a semiconductor integrated circuit effective in reducing a leak current in an SRAM memory cell and reducing current consumption. FIG. 15 is a block diagram showing a circuit configuration of the semiconductor integrated circuit according to the fifth embodiment of the present invention.

(Circuit Configuration)

The configuration of the semiconductor integrated circuit according to the fifth embodiment of the present invention is identical to the configuration of the semiconductor integrated circuit according to the first embodiment except that a first switching element SW1 shown in FIG. 15 is provided between a power supply VDD and a virtual power supply VDD1 of a peripheral circuit 200, and a third switching element SW3 is further provided between a ground power supply VSS and the virtual power supply VDD1 of the peripheral circuit 200. Thus, only a relationship of circuit connection of the first switching element SW1 and a relationship of circuit connection of the third switching element SW3 will be explained below with reference to FIG. 15 to avoid dual explanations.

The first switching element SW1 is provided between the power supply VDD and the virtual power supply VDD1 of the peripheral circuit 200 and cuts off or interrupts the virtual power supply VDD1 of the peripheral circuit 200 from the power supply VDD, based on a standby signal stby2 corresponding to a second output of a standby control circuit 500. The first switching element SW1 can be constituted of, specifically, a PMOS transistor mp6. The gate of the PMOS transistor mp6 is electrically connected to the standby control circuit 500 and receives therein the standby signal stby2 corresponding to the second output of the standby control circuit 500. The source of the PMOS transistor mp6 is electrically connected to the power supply VDD, whereas the drain of the PMOS transistor mp6 is electrically connected to the virtual power supply VDD1 of the peripheral circuit 200. That is, the PMOS transistor mp6 that constitutes the first switching element SW1 is a switch for turning on/off between the power supply VDD and the virtual power supply VDD1 of the peripheral circuit 200. When it is in an on state, the virtual power supply VDD1 reaches the same potential as the power supply VDD, whereas when it is in an off state, the virtual power supply VDD1 is interrupted from the power supply VDD. The PMOS transistor mp6 that constitutes the first switching element SW1 is set to a gate width made as smaller as possible than the total gate width of the peripheral circuit 200 so as to reduce a leak current at the standby of the peripheral circuit 200 as much as possible upon the off state and minimize an influence exerted on an operating speed of the peripheral circuit 200 upon its operation.

The third switching element SW3 is provided between the ground power supply VSS and the virtual power supply VDD1 of the peripheral circuit 200 and cuts off or interrupts the peripheral circuit 200 from the ground power supply VSS on the basis of the standby signal stby2 corresponding to the second output of the standby control circuit 500. The third switching element SW3 can be constituted of, specifically, an NMOS transistor mn9. The gate of the NMOS transistor mn9 is electrically connected to the standby control circuit 500 and receives therein the standby signal stby2 corresponding to the second output of the standby control circuit 500. The source of the NMOS transistor mn9 is electrically connected to the ground power supply VSS, whereas the drain of the NMOS transistor mn9 is electrically connected to the virtual power supply VDD1 of the peripheral circuit 200. That is, the NMOS transistor mn9 that constitutes the third switching element SW3 is a switch for turning on/off between the ground power supply VSS and the virtual power supply VDD1 of the peripheral circuit 200. When it is in an on state, the virtual power supply VDD1 becomes the same potential as the ground power supply VSS, whereas when it is in an off state, the virtual power supply VDD1 is interrupted from the ground power supply VSS. The NMOS transistor mn9 that constitutes the third switching element SW3 is brought to an off state when the peripheral circuit is in an operating state and brought to an on state when the peripheral circuit is in a standby state. Therefore, the NMOS transistor mn9 is set to a gate width made as small as possible in such a manner that the leak current is reduced as much as possible upon the off state and the potential of the virtual power supply VDD1 of the peripheral circuit can be lowered to a ground potential quickly upon the on state.

(Circuit Operation)

When the SRAM 1000 is during operation, a standby signal stby2 corresponding to a control signal switched upon operation is outputted from the standby control circuit 500, so the PMOS transistor mp6 provided between the power supply VDD and the virtual power supply VDD1 of the peripheral circuit 200 is brought to an on state, and the NMOS transistor mn9 is brought to an off state, whereby the peripheral circuit 200 performs a normal operation.

When the SRAM 1000 is at standby, a standby signal stby2 corresponding to a control signal switched upon standby is outputted from the standby control circuit 500 so that the PMOS transistor mp6 is brought to an off state, and the NMOS transistor mn9 is brought to an on state. Thus, the virtual power supply VDD1 of the peripheral circuit 200 is interrupted from the power supply VDD, so that the total leak current flowing through the peripheral circuit 200 is restricted by a leak current that flows through the PMOS transistor mp6 placed in the off state. Since the gate width of the PMOS transistor mp6 makes use of one sufficiently smaller than the total gate width of transistors that constitute the peripheral circuit 200, the leak current can greatly be reduced. Further, since the NMOS transistor mn9 is brought to the on state, the virtual power supply VDD1 of the peripheral circuit 200 is connected to the ground power supply VSS, and the potential of the virtual power supply VDD1 is lowered to the ground potential. Therefore, a period during which each node in the peripheral circuit 200 assumes an instable potential state on a transient basis can be reduced as much as possible, and unnecessary current consumption can be suppressed.

(Advantageous Effects)

According to the fifth embodiment of the present invention as mentioned above, in addition to the effects described in the first embodiment, the virtual power supply VDD1 of the peripheral circuit 200 is cut off or interrupted from the power supply VDD by means of the PMOS transistor mp6 that constitutes the first switching element SW1, upon the standby of the SRAM 1000, whereby the leak current flowing through the peripheral circuit 200 can greatly be reduced, thus making it possible to reduce the leak current in each memory cell and reduce current consumption of the whole SRAM 1000. Further, since the virtual power supply VDD1 is connected to the ground power supply VSS by means of the NMOS transistor mn9 that constitutes the third switching element SW3, and the potential of the virtual power supply VDD1 is lowered to the ground potential, a period over which each node in the peripheral circuit 200 assumes an instable potential state on a transient basis, can be reduced as much as possible, and needless current consumption can be suppressed.

Sixth Preferred Embodiment

Figure 16:
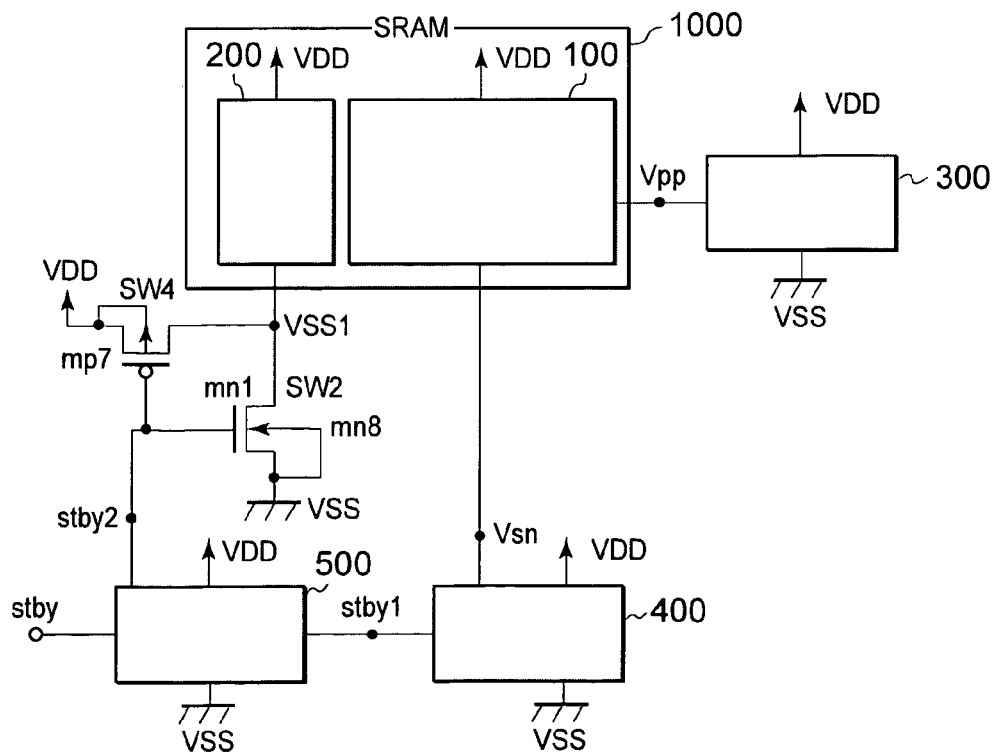
FIG. 16 is a block diagram illustrating a circuit configuration of a semiconductor integrated circuit according to a sixth embodiment of the present invention.

A sixth embodiment of the present invention provides a semiconductor integrated circuit effective in reducing a leak current in an SRAM memory cell and reducing current consumption. FIG. 16 is a block diagram showing a circuit configuration of the semiconductor integrated circuit according to the sixth embodiment of the present invention.

(Circuit Configuration)

The configuration of the semiconductor integrated circuit according to the sixth embodiment of the present invention is identical to the configuration of the semiconductor integrated circuit according to the first embodiment except that a second switching element SW2 shown in FIG. 16 is provided between a ground power supply VSS and a virtual ground power supply VSS1 of a peripheral circuit 200, and a fourth switching element SW4 is further provided between a power supply VDD and the virtual ground power supply VSS1 of the peripheral circuit 200. Thus, only a relationship of circuit connection of the second switching element SW2 and a relationship of circuit connection of the fourth switching element SW4 will be explained below with reference to FIG. 16 to avoid dual explanations.

The second switching element SW2 is provided between the ground power supply VSS and the virtual ground power supply VSS1 of the peripheral circuit 200 and cuts off or interrupts the virtual ground power supply VSS1 of the peripheral circuit 200 from the ground power supply VSS, based on a standby signal stby2 corresponding to a second output of a standby control circuit 500. The second switching element SW2 can be constituted of, specifically, an NMOS transistor mn8. The gate of the NMOS transistor mn8 is electrically connected to the standby control circuit 500 and receives therein the standby signal stby2 corresponding to the second output of the standby control circuit 500. The source of the NMOS transistor mn8 is electrically connected to the ground power supply VSS, whereas the drain of the NMOS transistor mn8 is electrically connected to the virtual ground power supply VSS1 of the peripheral circuit 200. That is, the NMOS transistor mn8 that constitutes the second switching element SW2 is a switch for turning on/off between the ground power supply VSS and the virtual ground power supply VSS1 of the peripheral circuit 200. When it is in an on state, the virtual ground power supply VSS1 reaches the same potential as the ground power supply VSS, whereas when it is in an off state, the virtual ground power supply VSS1 is interrupted from the ground power supply VSS. The NMOS transistor mn8 that constitutes the second switching element SW2 is set to a gate width made as smaller as possible than the total gate width of the peripheral circuit 200 so as to reduce a leak current at the standby of the peripheral circuit 200 as much as possible upon the off state and minimize an influence exerted on an operating speed of the peripheral circuit 200 upon its operation.

The fourth switching element SW4 is provided between the power supply VDD and the virtual ground power supply VSS1 of the peripheral circuit 200 and cuts off or interrupts the virtual ground power supply VSS1 of the peripheral circuit 200 from the power supply VDD on the basis of the standby signal stby2 corresponding to the second output of the standby control circuit 500. The fourth switching element SW4 can be constituted of, specifically, a PMOS transistor mp7. The gate of the PMOS transistor mp7 is electrically connected to the standby control circuit 500 and receives therein the standby signal stby2 corresponding to the second output of the standby control circuit 500. The source of the PMOS transistor mp7 is electrically connected to the power supply VDD, whereas the drain of the PMOS transistor mp7 is electrically connected to the virtual ground power supply VSS1 of the peripheral circuit 200. That is, the PMOS transistor mp7 that constitutes the fourth switching element SW4 is a switch for turning on/off between the ground power supply VSS and the virtual ground power supply VSS1 of the peripheral circuit 200. When it is in an on state, the virtual ground power supply VSS1 becomes the same potential as the power supply VDD, whereas when it is in an off state, the virtual ground power supply VSS1 is interrupted from the power supply VDD. The PMOS transistor mp7 that constitutes the fourth switching element SW4 is brought to an off state when the peripheral circuit is in an operating state and brought to an on state when the peripheral circuit is in a standby state. Therefore, the PMOS transistor mp7 is set to a gate width made as small as possible in such a manner that the leak current is reduced as much as possible upon the off state and the potential of the virtual ground power supply VSS1 of the peripheral circuit is raised to the power supply potential VDD quickly upon the on state.

(Circuit Operation)

When the SRAM 1000 is during operation, a standby signal stby2 corresponding to a control signal switched upon operation is outputted from the standby control circuit 500, so the NMOS transistor mn8 provided between the ground power supply VSS and the virtual ground power supply VSS1 of the peripheral circuit 200 is brought to an on state, and the PMOS transistor mnp7 provided between the power supply VDD and the virtual ground power supply VSS1 of the peripheral circuit 200 is brought to an off state, whereby the peripheral circuit 200 performs a normal operation.

When the SRAM 1000 is at standby, a standby signal stby2 corresponding to a control signal switched upon standby is outputted from the standby control circuit 500 so that the NMOS transistor mn8 is brought to an off state, and the PMOS transistor mp7 is brought to an on state. Thus, the virtual ground power supply VSS1 of the peripheral circuit 200 is interrupted from the ground power supply VSS, so that the total leak current flowing through the peripheral circuit 200 is restricted by a leak current that flows through the NMOS transistor mn8 placed in the off state. Since the gate width of the NMOS transistor mn8 makes use of one sufficiently smaller than the total gate width of transistors that constitute the peripheral circuit 200, the leak current can greatly be reduced. Further, since the PMOS transistor mp7 is brought to the on state, the virtual ground power supply VSS1 of the peripheral circuit 200 is connected to the power supply VDD, and the potential of the virtual ground power supply VSS1 is raised to the power supply potential VDD. Thus, a period during which each node in the peripheral circuit 200 assumes an instable potential state on a transient basis can be reduced as much as possible, and unnecessary current consumption can be suppressed.

(Advantageous Effects)

According to the sixth embodiment of the present invention as mentioned above, in addition to the effects described in the first embodiment referred to above, the virtual ground power supply VSS1 of the peripheral circuit 200 is cut off or interrupted from the ground power supply VSS by means of the NMOS transistor mn8 that constitutes the second switching element SW2, upon the standby of the SRAM 1000, whereby the leak current flowing through the peripheral circuit 200 can greatly be reduced, thus making it possible to reduce the leak current in each memory cell and reduce current consumption of the whole SRAM 1000. Further, the virtual ground power supply VSS1 is connected to the power supply VDD by means of the PMOS transistor mp7 that constitutes the fourth switching element SW4, and the potential of the virtual ground power supply VSS1 is raised to the power supply potential VDD, thus making it possible to reduce a period over which each node in the peripheral circuit 200 assumes an instable potential state on a transient basis, as much as possible, and suppress needless current consumption.

Seventh Preferred Embodiment

Figure 17:
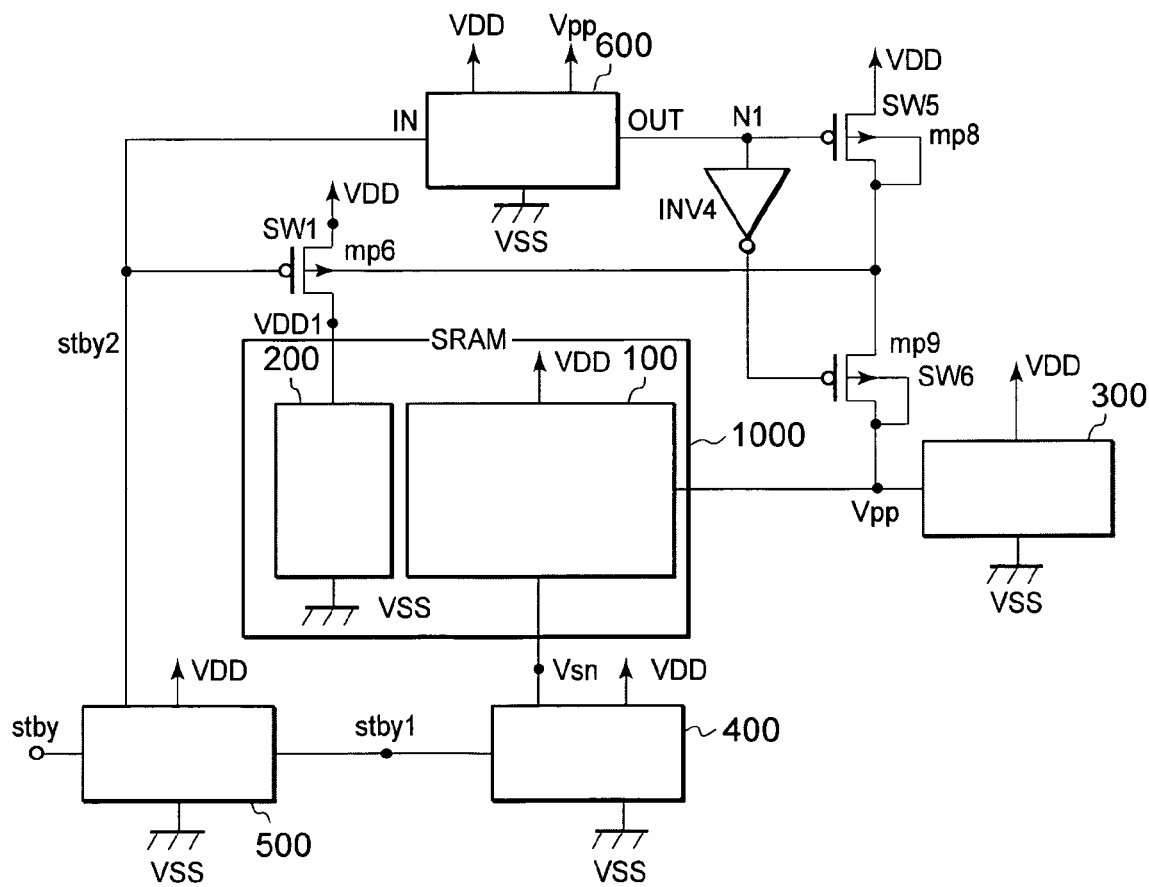
FIG. 17 is a block diagram depicting a circuit configuration of a semiconductor integrated circuit according to a seventh embodiment of the present invention.

A seventh embodiment of the present invention provides a semiconductor integrated circuit effective in reducing a leak current in an SRAM memory cell and reducing current consumption. FIG. 17 is a block diagram showing a circuit configuration of the semiconductor integrated circuit according to the seventh embodiment of the present invention.

(Circuit Configuration)

The configuration of the semiconductor integrated circuit according to the seventh embodiment of the present invention is identical to the configuration of the semiconductor integrated circuit according to the first embodiment except that a first switching element SW1 shown in FIG. 17 is provided between a power supply VDD and a virtual power supply VDD1 of a peripheral circuit 200, and that a first shifter circuit 600 is further provided between a standby control circuit 500 and a node N1, a fifth switching element SW5 is provided between the power supply VDD and a node N2, a sixth switching element SW6 is provided between the node N2 and a first substrate bias potential supply line Vpp, and an inverter INV4 is provided between the node N1 and the sixth switching element SW6. Thus, only a relationship of circuit connection of the first switching element SW1, a relationship of circuit connection of the first level shifter circuit 600, a relationship of circuit connection of the fifth switching element SW5, a relationship of circuit connection of the sixth switching element SW6, and a relationship of circuit connection of the inverter INV4 will be explained below with reference to FIG. 17 to avoid dual explanations.

The first switching element SW1 is provided between the power supply VDD and the virtual power supply VDD1 of the peripheral circuit 200 and cuts off or interrupts the peripheral circuit 200 from the power supply VDD, based on a standby signal stby2 corresponding to a second output of the standby control circuit 500. The first switching element SW1 can be constituted of, specifically, a PMOS transistor mp6. The gate of the PMOS transistor mp6 is electrically connected to the standby control circuit 500 and receives therein the standby signal stby2 corresponding to the second output of the standby control circuit 500. The source of the PMOS transistor mp6 is electrically connected to the power supply VDD, whereas the drain of the PMOS transistor mp6 is electrically connected to the virtual power supply VDD1 of the peripheral circuit 200. That is, the PMOS transistor mp6 that constitutes the first switching element SW1 is a switch for turning on/off between the power supply VDD and the virtual power supply VDD1 of the peripheral circuit 200. When it is in an on state, the virtual power supply VDD1 reaches the same potential as the power supply VDD, whereas when it is in an off state, the virtual power supply VDD1 is interrupted from the power supply VDD. The PMOS transistor mp6 that constitutes the first switching element SW1 is set to a gate width made as smaller as possible than the total gate width of the peripheral circuit 200 so as to reduce a leak current at the standby of the peripheral circuit 200 as much as possible upon the off state and minimize an influence exerted on an operating speed of the peripheral circuit 200 upon its operation.

An input IN of the first level shifter circuit 600 is electrically connected to the standby control circuit 500 and receives therein the standby signal stby2 corresponding to the second output of the standby control circuit 500. An output OUT of the first level shifter circuit 600 is connected to the node N1.

The fifth switching element SW5 is provided between the power supply VDD and the node N2 and interrupts the node N2 from the power supply VDD, based on the output OUT of the first level shifter circuit 600. The node N2 is electrically connected to a substrate for the PMOS transistor mp6 that constitutes the first switching element SW1. A substrate potential for the PMOS transistor mp6 assumes a potential at the node N2. The fifth switching element SW5 can be constituted of, specifically a PMOS transistor mp8. The gate of the PMOS transistor mp8 is connected to the node N1 and receives therein the output OUT sent from the first level shifter circuit 600. The source of the PMOS transistor mp8 is electrically connected to the power supply VDD, whereas the drain of the PMOS transistor mp8 is electrically connected to the node N2.

The sixth switching element SW6 is provided between the node N2 and the first substrate bias potential supply line Vpp and cuts off or interrupts the node N2 from the first substrate bias potential supply line Vpp, based on an inverted signal of the output OUT from the first level shifter circuit 600. The gate of a PMOS transistor mp9 is connected to the output of the inverter INV4 and accepts the inverted signal of the output OUT sent from the first level shifter circuit 600. The source of the PMOS transistor mp9 is electrically connected to the first substrate bias potential supply line Vpp, whereas the drain thereof is electrically connected to the node N2.

The first level shifter circuit 600, the inverter INV4, the fifth switching element SW5 and the sixth switching element SW6 are circuit elements for controlling the substrate potential of the PMOS transistor mp6 that constitutes the first switching element SW1. That is, when the PMOS transistor mp6 that constitutes the first switching element SW1 is placed in an on state, the PMOS transistor mp8 that constitutes the fifth switching element SW5 assumes an on state and the PMOS transistor mp9 that constitutes the sixth switching element SW6 assumes an off state. Thus, the node N2 is connected to the power supply VDD and hence the substrate potential of the PMOS transistor mp6 constituting the first switching element SW1 becomes identical to the power supply VDD. On the other hand, when the PMOS transistor mp6 that constitutes the first switching element SW1 is placed in an off state, the PMOS transistor mp8 that constitutes the fifth switching element SW5 assumes an off state and the PMOS transistor mp9 that constitutes the sixth switching element SW6 assumes an on state. Thus, the node N2 is connected to the first substrate bias potential supply line Vpp and hence the substrate potential of the PMOS transistor mp6 constituting the first switching element SW1 becomes identical to a first substrate bias potential Vpp higher than the power supply VDD. Thus, the threshold voltage of the PMOS transistor mp6 is raised so that the leak current at the standby of the peripheral circuit 200 is further reduced.

Figure 18:
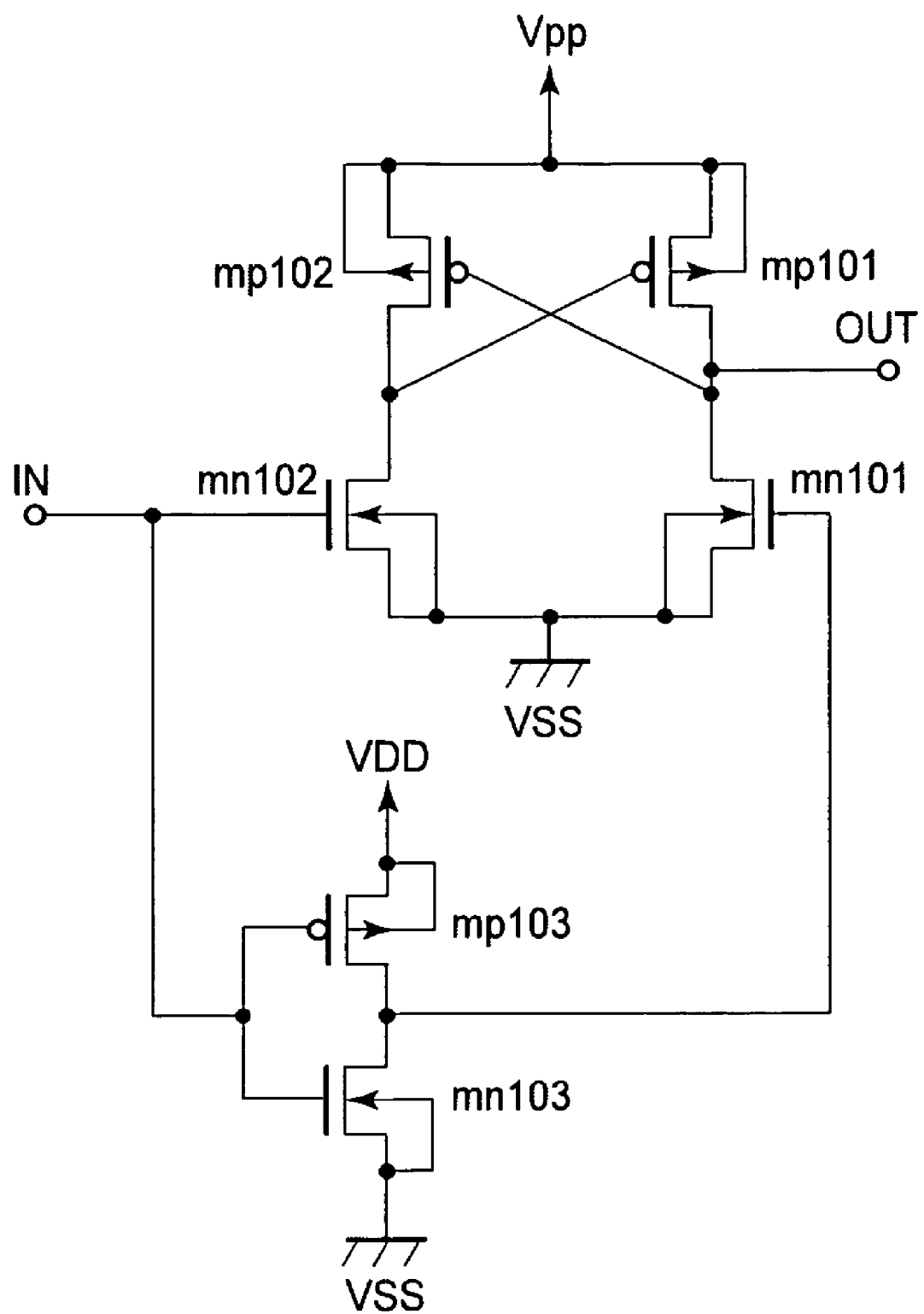
FIG. 18 is an equivalent circuit diagram showing a circuit configuration of a first level shifter circuit shown in FIG. 17.

Incidentally, the first level shifter circuit 600 can be realized by the known circuit configuration. FIG. 18 is an equivalent circuit diagram showing a circuit configuration of the first level shifter circuit 600 shown in FIG. 17. Described specifically, the first level shifter circuit 600 can be constituted of PMOS transistors mp101, mp102 and mp103, and NMOS transistors mn101, mn102 and mn103. A CMOS inverter is provided between the power supply VDD and ground power supply VSS. The CMOS inverter comprises a PMOS transistor mp103 and an NMOS transistor mn103. The gate of the PMOS transistor mp103 and the gate of the NMOS transistor mn103 are connected to an input terminal IN and receives therein the standby signal stby2 from the standby control circuit 500. The source of the PMOS transistor mp103 is connected to the power supply VDD, and the source of the NMOS transistor mn103 is connected to the ground power supply VSS. The drains of the PMOS transistor mp103 and NMOS transistor mn103 are respectively connected to the gate of the NMOS transistor mn101 as the output of the CMOS inverter. The gate of the NMOS transistor mn102 is connected to the input terminal IN. The sources of the NMOS transistors mn101 and mn102 are connected to the ground power supply VSS. The drain of the NMOS transistor mn101 is connected to the drain of the PMOS transistor mp101 and connected to an output terminal OUT. The drain of the NMOS transistor mn102 is connected to the drain of the PMOS transistor mp102. The gate of the PMOS transistor mp101 is connected to the drain of the NMOS transistor mn102 and the drain of the PMOS transistor mp102. The gate of the PMOS transistor mp102 is connected to the drain of the NMOS transistor mn101, the drain of the PMOS transistor mp101 and the output terminal OUT. The first level shifter circuit 600 outputs a first substrate bias potential Vpp higher than the power supply VDD.

(Circuit Operation)

When the SRAM 1000 is during operation, a standby signal stby2 corresponding to a control signal switched upon operation is outputted from the standby control circuit 500. Thus, the PMOS transistor mp6 provided between the power supply VDD and the virtual power supply VDD1 of the peripheral circuit 200 is brought to an on state so that the peripheral circuit 200 performs a normal operation. Further, the standby signal stby2 is inputted to the input IN of the first level shifter circuit 600 and a level-converted signal is outputted from the output OUT. The outputted signal is supplied to the gate of the PMOS transistor mp8 that constitutes the fifth switching element SW5 and inputted to the inverter INV4. The inverter INV4 outputs an inverted signal, which in turn is supplied to the gate of the PMOS transistor mp9 that constitutes the sixth switching element SW6. As a result, the PMOS transistor mp8 that constitutes the fifth switching element SW5 is brought to an on state and the PMOS transistor mp9 that constitutes the sixth switching element SW6 is brought to an off state. Therefore, the node N2 electrically connected to the substrate for the PMOS transistor mp6 constituting the first switching element SW1 is connected to the power supply VDD and cut off or interrupted from the first substrate bias potential supply line Vpp. As a result, the substrate potential of the PMOS transistor mp6 that constitutes the first switching element SW1 becomes identical to the power supply VDD.

When the SRAM 1000 is at standby, a standby signal stby2 corresponding to a control signal switched upon standby is outputted from the standby control circuit 500. Thus, the PMOS transistor mp6 provided between the power supply VDD and the virtual power supply VDD1 of the peripheral circuit 200 is brought to an off state so that the peripheral circuit 200 performs a normal operation. Further, the standby signal stby2 is inputted to the input IN of the first level shifter circuit 600 and a level-converted signal is outputted from the output OUT. The outputted signal is supplied to the gate of the PMOS transistor mp8 that constitutes the fifth switching element SW5 and inputted to the inverter INV4. The inverter INV4 outputs an inverted signal, which in turn is supplied to the gate of the PMOS transistor mp9 that constitutes the sixth switching element SW6. Consequently, the PMOS transistor mp8 that constitutes the fifth switching element SW5 is brought to an off state and the PMOS transistor mp9 that constitutes the sixth switching element SW6 is brought to an on state. Therefore, the node N2 electrically connected to the substrate for the PMOS transistor mp6 constituting the first switching element SW1 is connected to the first substrate bias potential supply line Vpp and is cut off or interrupted from the power supply VDD. As a result, the substrate potential of the PMOS transistor mp6 that constitutes the first switching element SW1 becomes identical to the first substrate bias potential Vpp. Since the first substrate bias potential Vpp is higher than the power supply potential VDD, the leak current at the standby of the peripheral circuit 200 is further reduced.

(Advantageous Effects)

According to the seventh embodiment of the present invention as mentioned above, in addition to the effects described in the first embodiment referred to above, the peripheral circuit 200 is cut off or interrupted from the power supply VDD by means of the PMOS transistor mp6 that constitutes the first switching element SW1, upon the standby of the SRAM 1000, whereby the leak current flowing through the peripheral circuit 200 can greatly be reduced, thus making it possible to reduce the leak current in each memory cell and reduce current consumption of the whole SRAM 1000.

Further, since the substrate potential of the PMOS transistor mp6 that constitutes the first switching element SW1 is made higher than the power supply potential VDD upon standby, the leak current at the standby of the peripheral circuit 200 is further reduced.

At standby, the application of the substrate bias potential to the PMOS transistor mp6 that constitutes the first switching element SW1 makes use of a substrate bias generating circuit 300 for supplying it to the first and second load PMOS transistors mp1 and mp2 of each memory cell. Therefore, there is no need to provide a new bias circuit. Additional current consumption and an increase in area are almost unnecessary. An increase in current consumption and an increase in layout area due to the provision of the level shifter circuit 600, fifth switching element SW5, sixth switching element SW6 and inverter INV4 are so small that they may be ignored. Since the leak current flowing through the PMOS transistor mp6 can be reduced by the substrate control of the PMOS transistor mp6 that constitutes the first switching element SW1, leaks can be reduced even when the gate width of the PMOS transistor mp6 is made larger so as not to influence the speed of the peripheral circuit 200 at its operation.

Eighth Preferred Embodiment

Figure 19:
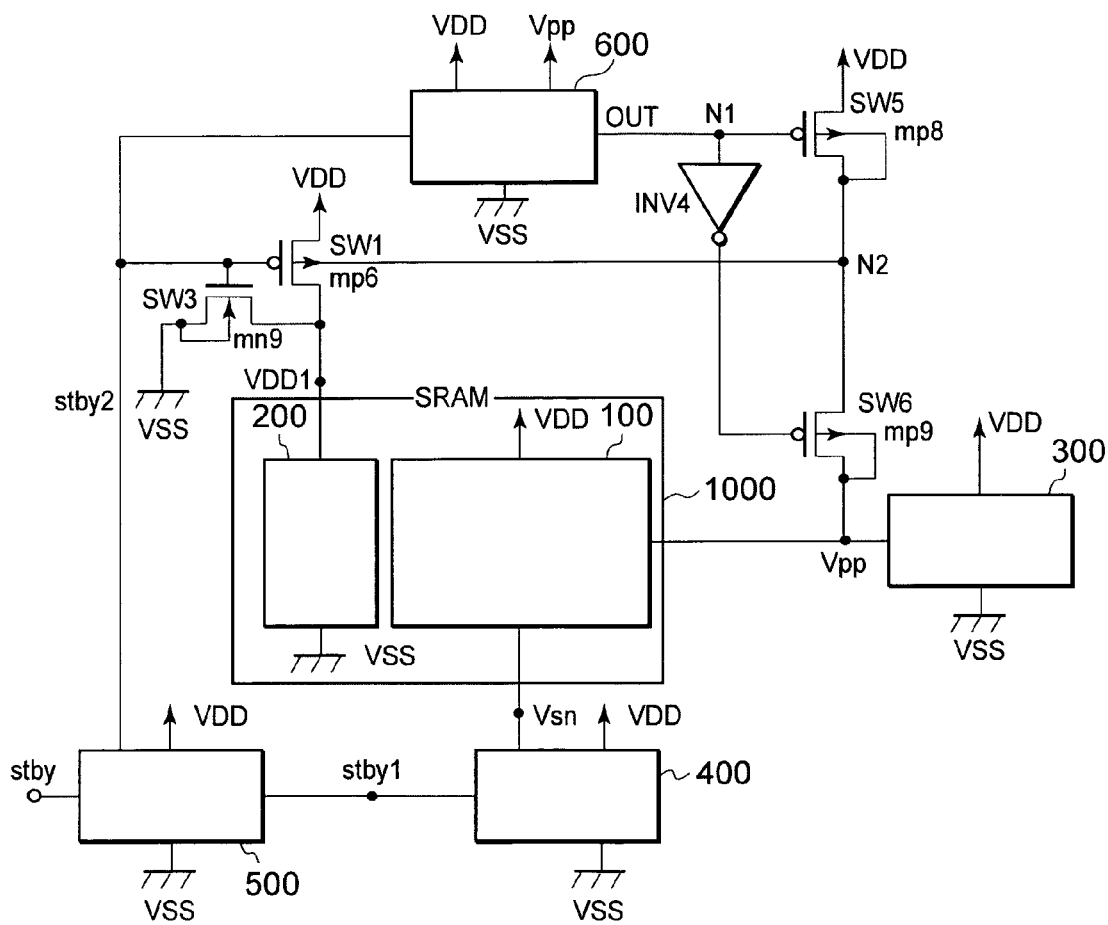
FIG. 19 is a block diagram depicting a circuit configuration of a semiconductor integrated circuit according to an eighth embodiment of the present invention.

An eighth embodiment of the present invention provides a semiconductor integrated circuit effective in reducing a leak current in an SRAM memory cell and reducing current consumption. FIG. 19 is a block diagram showing a circuit configuration of a semiconductor integrated circuit according to the eighth embodiment of the present invention.

(Circuit Configuration)

The configuration of the semiconductor integrated circuit according to the eighth embodiment of the present invention is identical to the configuration of the semiconductor integrated circuit according to the seventh embodiment except that a third switching element SW3 shown in FIG. 19 is provided between a ground power supply VSS and a virtual power supply VDD1 of a peripheral circuit 200. Thus, only a relationship of circuit connection of the third switching element SW3 will be explained below with reference to FIG. 19 to avoid dual explanations.

The third switching element SW3 is provided between the ground power supply VSS and the virtual power supply VDD1 of the peripheral circuit 200 and cuts off or interrupts the virtual power supply VDD1 of the peripheral circuit 200 from the ground power supply VSS on the basis of a standby signal stby2 corresponding to a second output of a standby control circuit 500. The third switching element SW3 can be constituted of, specifically, an NMOS transistor mn9. The gate of the NMOS transistor mn9 is electrically connected to the standby control circuit 500 and receives therein the standby signal stby2 corresponding to the second output of the standby control circuit 500. The source of the NMOS transistor mn9 is electrically connected to the ground power supply VSS, whereas the drain of the NMOS transistor mn9 is electrically connected to the virtual power supply VDD1 of the peripheral circuit 200. That is, the NMOS transistor mn9 that constitutes the third switching element SW3 is a switch for turning on/off between the ground power supply VSS and the virtual power supply VDD1 of the peripheral circuit 200. When it is in an on state, the virtual power supply VDD1 becomes the same potential as the ground power supply VSS, whereas when it is in an off state, the virtual power supply VDD1 is interrupted from the ground power supply VSS. The NMOS transistor mn9 that constitutes the third switching element SW3 is brought to an off state when the peripheral circuit is in an operating state and brought to an on state when the peripheral circuit is in a standby state. Therefore, the NMOS transistor mn9 is set to a gate width small as practicable so as to reduce a leak current as much as possible upon the off state and lower the potential of the virtual power supply VDD1 of the peripheral circuit to the ground potential quickly upon the on state.

(Circuit Operation)

When the SRAM 1000 is during operation, a standby signal stby2 corresponding to a control signal switched upon operation is outputted from the standby control circuit 500, so the PMOS transistor mp6 provided between the power supply VDD and the virtual power supply VDD1 of the peripheral circuit 200 is brought to an on state, and the NMOS transistor mn9 is brought to an off state, whereby the peripheral circuit 200 performs a normal operation.

When the SRAM 1000 is at standby, a standby signal stby2 corresponding to a control signal switched upon standby is outputted from the standby control circuit 500 so that the PMOS transistor mp6 is brought to an off state, and the NMOS transistor mn9 is brought to an on state. Thus, the virtual power supply VDD1 of the peripheral circuit 200 is interrupted from the power supply VDD, so that the total leak current flowing through the peripheral circuit 200 is restricted by a leak current that flows through the PMOS transistor mp6 placed in the off state. Since the gate width of the PMOS transistor mp6 makes use of one sufficiently smaller than the total gate width of transistors that constitute the peripheral circuit 200, the leak current can greatly be reduced. Further, since the NMOS transistor mn9 is brought to the on state, the virtual power supply VDD1 of the peripheral circuit 200 is connected to the ground power supply VSS, and the potential of the virtual power supply VDD1 is lowered to the ground potential. Therefore, a period during which each node in the peripheral circuit 200 assumes an instable potential state on a transient basis can be reduced as much as possible, and unnecessary current consumption can be suppressed.

(Advantageous Effects)

According to the eighth embodiment of the present invention as described above, in addition to the effects described in the seventh embodiment, the virtual power supply VDD1 of the peripheral circuit 200 is cut off or interrupted from the power supply VDD by means of the PMOS transistor mp6 that constitutes the first switching element SW1, upon the standby of the SRAM 1000, whereby the leak current flowing through the peripheral circuit 200 can greatly be reduced, thus making it possible to reduce the leak current in each memory cell and reduce current consumption of the whole SRAM 1000. Further, since the virtual power supply VDD1 is connected to the ground power supply VSS by means of the NMOS transistor mn9 that constitutes the third switching element SW3, and the potential of the virtual power supply VDD1 is lowered to the ground potential, a period over which each node in the peripheral circuit 200 assumes an instable potential state on a transient basis, can be reduced as much as possible, and needless current consumption can be suppressed.

Ninth Preferred Embodiment

Figure 20:
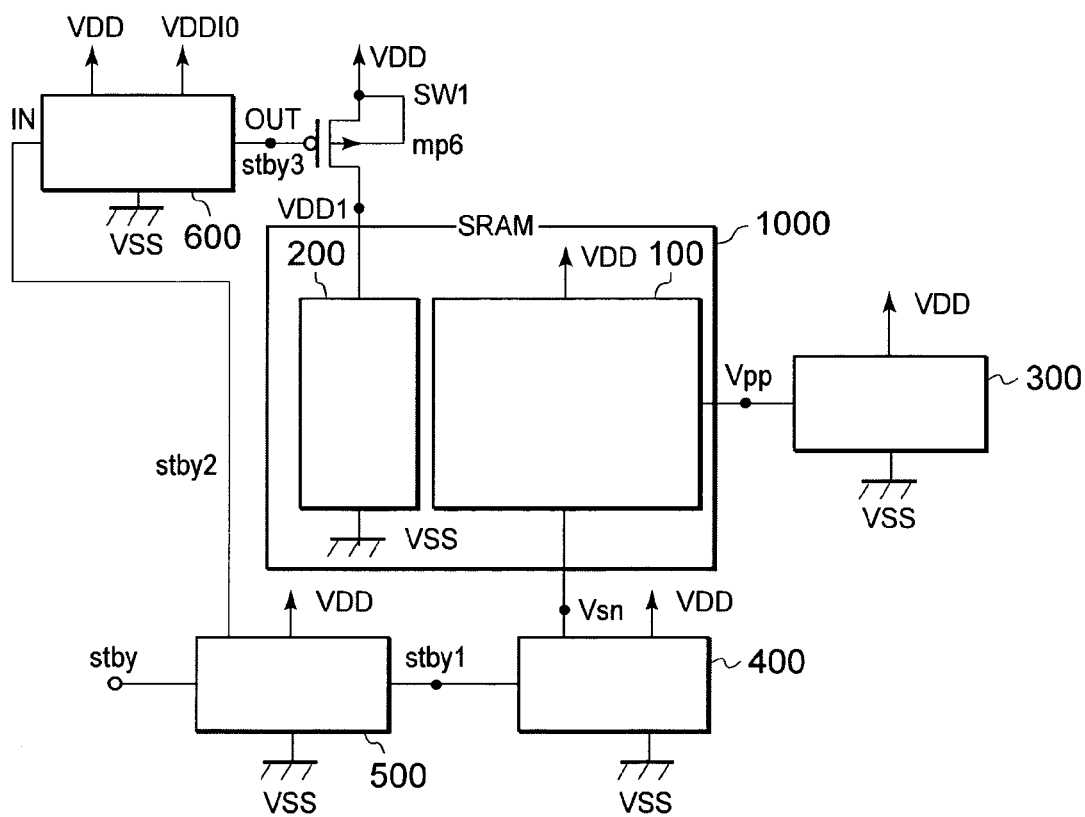
FIG. 20 is a block diagram illustrating a circuit configuration of a semiconductor integrated circuit according to a ninth embodiment of the present invention.

A ninth embodiment of the present invention provides a semiconductor integrated circuit effective in reducing a leak current in an SRAM memory cell and reducing current consumption. FIG. 20 is a block diagram showing a circuit configuration of the semiconductor integrated circuit according to the ninth embodiment of the present invention.

(Circuit Configuration)

The configuration of the semiconductor integrated circuit according to the ninth embodiment of the present invention is identical to the configuration of the semiconductor integrated circuit according to the first embodiment except that a first switching element SW1 shown in FIG. 20 is provided between a power supply VDD and a peripheral circuit 200, and a first level shifter circuit 600 is further provided between the first switching element SW1 and a standby control circuit 500. Thus, only a relationship of circuit connection of the first switching element SW1 and a relationship of circuit connection of the first level shifter circuit 600 will be explained below with reference to FIG. 20 to avoid dual explanations.

The first switching element SW1 is provided between the power supply VDD and the peripheral circuit 200 and interrupts the peripheral circuit 200 from the power supply VDD, based on a standby signal stby3 corresponding to the output of the first level shifter circuit 600. An input IN of the first level shifter circuit 600 is electrically connected to the standby control circuit 500 and receives therein a standby signal stby2 corresponding to a second output of the standby control circuit 500. An output OUT of the first level shifter circuit 600 is electrically connected to the first switching element SW1. The first level shifter circuit 600 takes such a configuration that it converts a High level potential of a standby signal stby1 outputted from the standby control circuit 500 from a power supply voltage VDD for an SRAM to a higher potential level of VDDIO for an IO buffer and inputs it to the first switching element SW1. In general, a semiconductor integrated circuit is equipped with an IO buffer to perform the operation of inputting/outputting a signal sent from an internal logic circuit via each external pin. Since the power supply voltage for the IO buffer normally aims to interface with the outside, power supply voltages such as 3.3V and 2.5V higher than an internal power supply used in an internal circuit are used.

The first switching element SW1 can be constituted of, specifically, a PMOS transistor mp6. The gate of the PMOS transistor mp6 is electrically connected to the output OUT of the first level shifter circuit 600 and receives therein the standby signal stby3 corresponding to the output from the output OUT of the first level shifter circuit 600. The source of the PMOS transistor mp6 is electrically connected to the power supply VDD, whereas the drain of the PMOS transistor mp6 is electrically connected to a virtual power supply VDD1 of the peripheral circuit 200. That is, the PMOS transistor mp6 that constitutes the first switching element SW1 is a switch for turning on/off between the power supply VDD and the virtual power supply VDD1 of the peripheral circuit 200. When it is in an on state, the virtual power supply VDD1 becomes the same potential as the power supply VDD, whereas when it is in an off state, the virtual power supply VDD1 is interrupted from the power supply VDD. The PMOS transistor mp6 that constitutes the first switching element SW1 is set to a gate width made as smaller as possible than the total gate width of the peripheral circuit 200 so as to reduce a leak current at the standby of the peripheral circuit 200 as much as possible upon the off state and minimize an influence exerted on an operating speed of the peripheral circuit 200 upon its operation.

(Circuit Operation)

When the SRAM 1000 is at operation, a standby signal stby2 corresponding to a control signal switched upon operation is outputted from the standby control circuit 500, and the first level shifter circuit 600 having received the input of the standby signal stby2 supplies a standby signal stby3 for a ground power supply VSS to the gate of the PMOS transistor mp6. Thus, the PMOS transistor mp6 is brought to an on state so that the peripheral circuit 200 performs a normal operation.

When the SRAM 1000 is at standby, a standby signal stby2 corresponding to a control signal switched upon standby is outputted from the standby control circuit 500, and the first level shifter circuit 600 having received the input of the standby signal stby2 supplies a standby signal stby3 having a potential level of VDDIO for the IO buffer, higher than the power supply voltage VDD to the gate of the PMOS transistor mp6. As a result, the PMOS transistor mp6 is brought to an off state. Since, at this time, the potential of the source of the PMOS transistor mp6 is identical to the power supply voltage VDD, and the potential of the gate thereof is of the potential level of VDDIO for the IO buffer, higher than the power supply voltage VDD, a reverse-bias applied state is held between the gate and source voltages of the PMOS transistor mp6. Therefore, a leak current that flows through the PMOS transistor mp6 placed in the off state can be greatly reduced.

(Advantageous Effects)

According to the ninth embodiment of the present invention as described above, in addition to the effects described in the first embodiment, the peripheral circuit 200 is interrupted from the power supply VDD by means of the PMOS transistor mp6 that constitutes the first switching element SW1, upon the standby of the SRAM 100, whereby the leak current flowing through the peripheral circuit 200 can be greatly reduced, thus making it possible to reduce the leak current in each memory cell and reduce current consumption of the entire SRAM 1000.

Further, since the leak current that flows through the PMOS transistor mp6 upon standby can be more reduced, the leak current flowing through the peripheral circuit 200 can be reduced and current consumption of the SRAM 1000 at standby can be further reduced. Current consumption and an increase in layout area due to the added level shifter circuit 600 are so small that they may be ignored.

Tenth Preferred Embodiment

Figure 21:
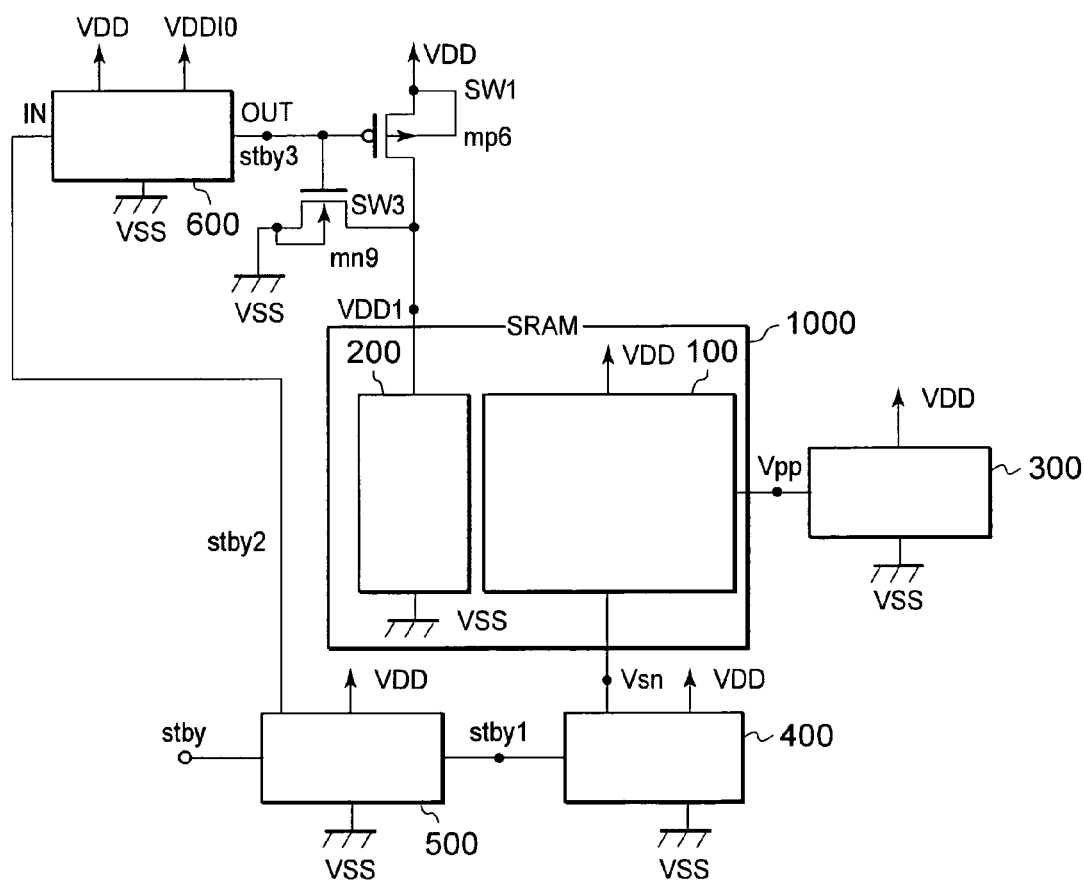
FIG. 21 is a block diagram showing a circuit configuration of a semiconductor integrated circuit according to a tenth embodiment of the present invention.

A tenth embodiment of the present invention provides a semiconductor integrated circuit effective in reducing a leak current in an SRAM memory cell and reducing current consumption. FIG. 21 is a block diagram showing a circuit configuration of the semiconductor integrated circuit according to the tenth embodiment of the present invention.

(Circuit Configuration)

The configuration of the semiconductor integrated circuit according to the tenth embodiment of the present invention is identical to the configuration of the semiconductor integrated circuit according to the ninth embodiment except that a third switching element SW3 shown in FIG. 21 is provided between a ground power supply VSS and a virtual power supply VDD1 of a peripheral circuit 200. Thus, only a relationship of circuit connection of the third switching element SW3 will be explained below with reference to FIG. 21 to avoid dual explanations.

The third switching element SW3 is provided between the ground power supply VSS and the virtual power supply VDD1 of the peripheral circuit 200 and cuts off or interrupts the virtual power supply VDD1 of the peripheral circuit 200 from the ground power supply VSS on the basis of a standby signal stby3 corresponding to an output of a first level shifter circuit 600. The third switching element SW3 can be constituted of, specifically, an NMOS transistor mn9. The gate of the NMOS transistor mn9 is electrically connected to the output OUT of the first level shifter circuit 600 and receives therein the standby signal stby3 corresponding to the output of the first level shifter circuit 600. The source of the NMOS transistor mn9 is electrically connected to the ground power supply VSS, whereas the drain of the NMOS transistor mn9 is electrically connected to the virtual power supply VDD1 of the peripheral circuit 200. That is, the NMOS transistor mn9 that constitutes the third switching element SW3 is a switch for turning on/off between the ground power supply VSS and the virtual power supply VDD1 of the peripheral circuit 200. When it is in an on state, the virtual power supply VDD1 becomes the same potential as the ground power supply VSS, whereas when it is in an off state, the virtual power supply VDD1 is interrupted from the ground power supply VSS. The NMOS transistor mn9 that constitutes the third switching element SW3 is brought to an off state when the peripheral circuit is in an operating state and brought to an on state when the peripheral circuit is in a standby state. Therefore, the NMOS transistor mn9 is set to a gate width small as practicable so as to reduce a leak current as much as possible upon the off state and lower the potential of the virtual power supply VDD1 of the peripheral circuit to the ground potential quickly upon the on state.

(Circuit Operation)

When the SRAM 1000 is during operation, a standby signal stby2 corresponding to a control signal switched upon operation is outputted from a standby control circuit 500, and the first level shifter circuit 600 having received the input of the standby signal stby2 supplies a standby signal stby3 for the ground power supply VSS to the gates of the PMOS transistor mp6 and NMOS transistor mn9. Thus, the PMOS transistor mp6 provided between the power supply VDD and the power supply VDD and the virtual power supply VDD1 of the peripheral circuit 200 is brought to an on state and the NMOS transistor mn9 is brought to an off state, so that the peripheral circuit 200 performs a normal operation.

When the SRAM 1000 is at standby, a standby signal stby2 corresponding to a control signal switched upon standby is outputted from the standby control circuit 500, and the first level shifter circuit 600 having received the input of the standby signal stby2 supplies a standby signal stby3 having a potential level of VDDIO for an IO buffer, higher than the power supply voltage VDD to the gates of the PMOS transistor mp6 and NMOS transistor mn9. As a result, the PMOS transistor mp6 is brought to an off state, and the NMOS transistor mn9 is brought to an on state. Thus, the virtual power supply VDD1 of the peripheral circuit 200 is interrupted from the power supply VDD, so that the total leak current flowing through the peripheral circuit 200 is restricted by a leak current that flows through the PMOS transistor mp6 placed in the off state. Since, however, the potential of the source of the PMOS transistor mp6 is identical to the power supply voltage VDD, and the potential of the gate thereof is of the potential level of VDDIO for the IO buffer, higher than the power supply voltage VDD, a reverse-bias applied state is held between the gate and source voltages of the PMOS transistor mp6. Therefore, a leak current that flows through the PMOS transistor mp6 placed in the off state can be greatly reduced. Further, since the gate width of the PMOS transistor mp6 makes use of one sufficiently smaller than the total gate width of transistors that constitute the peripheral circuit 200, the leak current can greatly be reduced. Further, since the NMOS transistor mn9 is brought to the on state, the virtual power supply VDD1 of the peripheral circuit 200 is connected to the ground power supply VSS, and the potential of the virtual power supply VDD1 is lowered to the ground potential. Therefore, a period during which each node in the peripheral circuit 200 assumes an instable potential state on a transient basis can be reduced as much as possible, and unnecessary current consumption can be suppressed.

(Advantageous Effects)

According to the tenth embodiment of the present invention as described above, in addition to the effects described in the ninth embodiment, the virtual power supply VDD1 is connected to the ground power supply VSS by means of the NMOS transistor mn9 that constitutes the third switching element SW3, and the potential of the virtual power supply VDD1 is lowered to the ground potential. Therefore, the period over which each node in the peripheral circuit 200 assumes an instable potential state on a transient basis, can be reduced as much as possible, and extra current consumption can be suppressed.

Eleventh Preferred Embodiment

Figure 22:
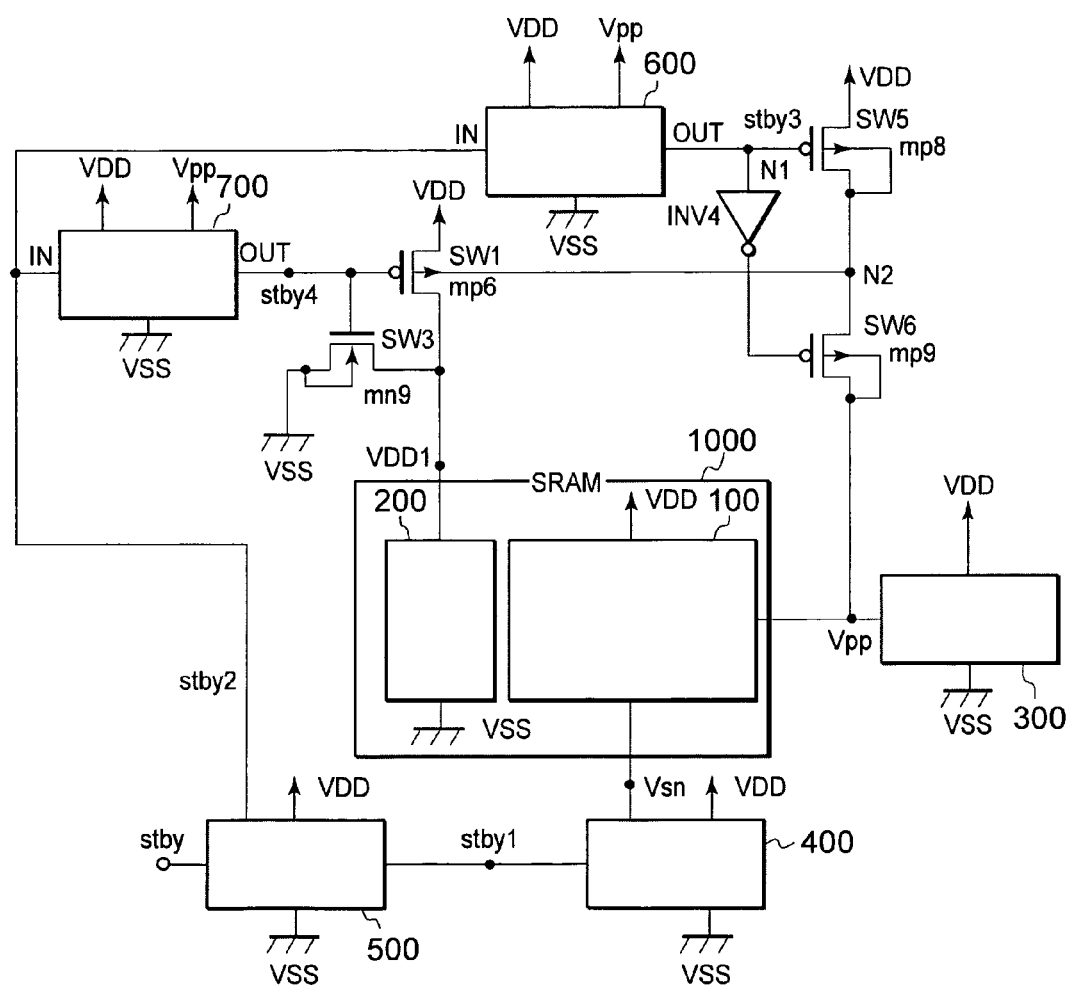
FIG. 22 is a block diagram depicting a circuit configuration of a semiconductor integrated circuit according to an eleventh embodiment of the present invention.

An eleventh embodiment of the present invention provides a semiconductor integrated circuit effective in reducing a leak current in an SRAM memory cell and reducing current consumption. FIG. 22 is a block diagram showing a circuit configuration of the semiconductor integrated circuit according to the eleventh embodiment of the present invention.

(Circuit Configuration)

The configuration of the semiconductor integrated circuit according to the eleventh embodiment of the present invention is identical to the configuration of the semiconductor integrated circuit according to the eighth embodiment except that a second level shifter circuit 700 shown in FIG. 22 is provided between a standby control circuit 500 and a first switching element SW1. Thus, only a relationship of circuit connection of the second level shifter circuit 700 will be explained below with reference to FIG. 22 to avoid dual explanations.

The second level shifter circuit 700 is connected between the standby control circuit 500 and a PMOS transistor mp6 constituting the first switching element SW1 and an NMOS transistor mn9 constituting a third switching element SW3. An input IN of the second level shifter circuit 700 is connected to the standby control circuit 500. An output OUT of the second level shifter circuit 700 is connected to the gates of the PMO transistor mp6 constituting the first switching element SW1 and the NMOS transistor mn9 constituting the third switching element SW3. The second level shifter circuit 700 receives the input of a standby signal stby2 outputted form the standby control circuit 500 and generates a standby4 having a potential VDDIO higher than a power supply VDD.

The first switching element SW1 is provided between the power supply VDD and a virtual power supply VDD1 of a peripheral circuit 200 and interrupts the peripheral circuit 200 from the power supply VDD, based on a standby signal stby4 corresponding to the output of the second level shifter circuit 700. The third switching element SW3 is provided between a ground power supply VSS and the virtual power supply VDD1 of the peripheral circuit 200 and interrupts the peripheral circuit 200 from the ground power supply VSS on the basis of the standby signal stby4 corresponding to the output of the second level shifter circuit 700. An input IN of the second level shifter circuit 700 is electrically connected to the standby control circuit 500 and receives therein a standby signal stby2 corresponding to a second output of the standby control circuit 500. An output OUT of the second level shifter circuit 700 is electrically connected to the first switching element SW1 and the third switching element SW3. The second level shifter circuit 700 takes such a configuration that it converts a High level potential of the standby signal stby2 outputted from the standby control circuit 500 to a potential level of VDDIO for an IO buffer, which is higher than a power supply voltage VDD for an SRAM and inputs it to the first switching element SW1 and the third switching element SW3. In general, a semiconductor integrated circuit is equipped with an IO buffer to perform the operation of inputting/outputting a signal sent from an internal logic circuit via each external pin. Since the power supply voltage for the IO buffer normally aims to interface with the outside, power supply voltages such as 3.3V and 2.5V higher than an internal power supply used in an internal circuit are used.

The first switching element SW1 can be constituted of, specifically, a PMOS transistor mp6. The gate of the PMOS transistor mp6 is electrically connected to the output OUT of the second level shifter circuit 700 and receives therein the standby signal stby4 corresponding to the output from the output OUT of the second level shifter circuit 700. The source of the PMOS transistor mp6 is electrically connected to the power supply VDD, whereas the drain of the PMOS transistor mp6 is electrically connected to the virtual power supply VDD1 of the peripheral circuit 200. That is, the PMOS transistor mp6 that constitutes the first switching element SW1 is a switch for turning on/off between the power supply VDD and the virtual power supply VDD1 of the peripheral circuit 200.

The third switching element SW3 can be constituted of, specifically, an NMOS transistor mn9. The gate of the NMOS transistor mn9 is electrically connected to the output OUT of the second level shifter circuit 700 and receives therein the standby signal stby4 corresponding to the output from the output OUT of the second level shifter circuit 700. The source of the NMOS transistor mn9 is electrically connected to the ground power supply VSS, whereas the drain of the NMOS transistor mn9 is electrically connected to the virtual power supply VDD1 of the peripheral circuit 200. That is, the NMOS transistor mn9 that constitutes the third switching element SW3 is a switch for turning on/off between the ground power supply VSS and the virtual power supply VDD1 of the peripheral circuit 200.

(Circuit Operation)

When the SRAM 1000 is during operation, a standby signal stby2 corresponding to a control signal switched upon operation is outputted from the standby control circuit 500, and a first level shifter circuit 600 having received the input of the standby signal stby2 supplies a standby signal stby3 for the ground power supply VSS to the gates of the PMOS transistor mp6 and NMOS transistor mn9. Thus, the PMOS transistor mp6 is brought to an on state and the NMOS transistor mn9 is brought to an off state so that the peripheral circuit 200 performs a normal operation.

When the SRAM 1000 is at standby, a standby signal stby2 corresponding to a control signal switched upon standby is outputted from the standby control circuit 500, and the first level shifter circuit 600 having received the input of the standby signal stby2 therein supplies a standby signal stby3 having a potential level of VDDIO for the IO buffer, higher than the power supply voltage VDD to the gates of the PMOS transistor mp6 and NMOS transistor mn9. As a result, the PMOS transistor mp6 is brought to an off state and the NMOS transistor mn9 is brought to an on state. Since, at this time, the potential of the source of the PMOS transistor mp6 is identical to the power supply voltage VDD, and the potential of the gate thereof is of the potential level of VDDIO for the IO buffer, higher than the power supply voltage VDD, a reverse-bias applied state is held between the gate and source voltages of the PMOS transistor mp6. Therefore, a leak current that flows through the PMOS transistor mp6 placed in the off state can be greatly reduced.

(Advantageous Effects)

According to the eleventh embodiment of the present invention as described above, in addition to the effects described in the eighth embodiment, since the leak current that flows through the PMOS transistor mp6 can be more reduced upon standby of the SRAM 1000, the leak current flowing through the peripheral circuit 200 can be reduced and current consumption of the SRAM 1000 at standby can be further reduced. Current consumption and an increase in layout area due to the added level shifter circuit 700 are so small that they may be ignored.

Twelfth Preferred Embodiment

Figure 23:
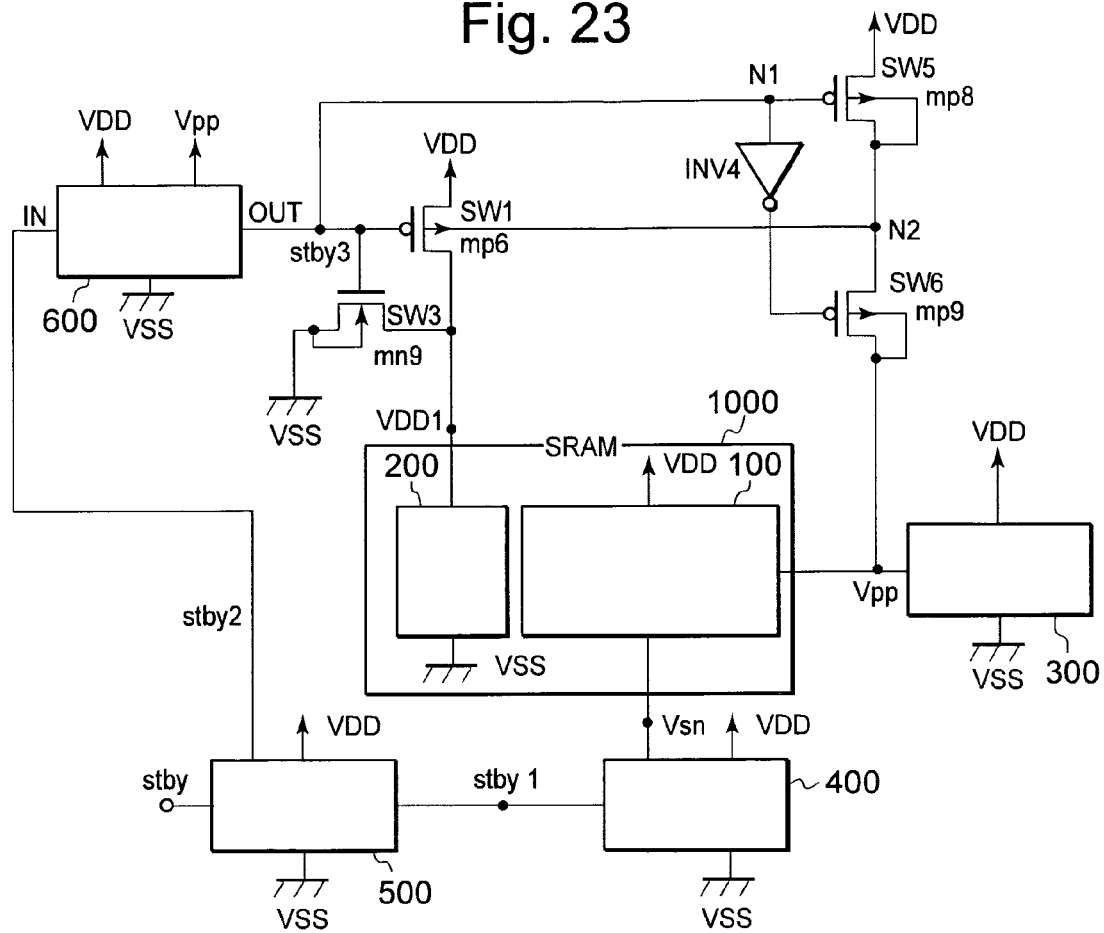
FIG. 23 is a block diagram showing a circuit configuration of a semiconductor integrated circuit according to a twelfth embodiment of the present invention.

A twelfth embodiment of the present invention provides a semiconductor integrated circuit effective in reducing a leak current in an SRAM memory cell and reducing current consumption. FIG. 23 is a block diagram showing a circuit configuration of the semiconductor integrated circuit according to the twelfth embodiment of the present invention.

(Circuit Configuration)

The configuration of the semiconductor integrated circuit according to the twelfth embodiment of the present invention is identical to the configuration of the semiconductor integrated circuit according to the eleventh embodiment except that only a first level shifter circuit 600 shown in FIG. 23 is provided and no second level shifter circuit 700 is provided. Thus, only a relationship of circuit connection of the first level shifter circuit 600 will be explained below with reference to FIG. 23 to avoid dual explanations.

An input IN of the first level shifter circuit 600 is electrically connected to a standby control circuit 500. An output OUT of the first level shifter circuit 600 is connected to the gate of a PMOS transistor mp6 constituting a first switching element SW1, the gate of an NMOS transistor mn9 constituting a third switching element SW3, the gate of a PMOS transistor mp8 constituting a fifth switching element SW5 and the input of an inverter INV4. When the input IN of the first level shifter circuit 600 receives a standby signal stby2 outputted from the standby control circuit 500 therein, the first level shifter circuit 600 generates a standby signal stby3 having a first substrate bias potential Vpp higher than a power supply VDD at a High level. The standby signal stby3 is inputted to the gate of the PMOS transistor mp6 constituting the first switching element SW1, the gate of the NMOS transistor mn9 constituting the third switching element SW3, and the gate of the PMOS transistor mp8 constituting the fifth switching element SW5. Further, an inverted signal thereof inverted via the inverter INV4 is inputted to the gate of a PMOS transistor mp9 constituting a sixth switching element SW6.

(Circuit Operation)

When the SRAM 1000 is during operation, a standby signal stby2 corresponding to a control signal switched upon operation is outputted from the standby control circuit 500, and the first level shifter circuit 600 having received the input of the standby signal stby2 therein supplies a standby signal stby3 for a ground power supply VSS to the gates of the PMOS transistor mp6 and NMOS transistor mn9 and the PMOS transistor mp8. Further, an inverted signal of the standby signal stby3 is supplied to the gate of the PMOS transistor mp9 via the inverter INV4. Thus, the PMOS transistor mp6 is brought to an on state and the NMOS transistor mn9 is brought to an off state so that a peripheral circuit 200 performs a normal operation. Further, since the PMOS transistor mp8 is brought to an on state, and the PMOS transistor mp9 is brought to an off state, a node N2 is connected to the power supply VDD and the potential of a substrate for the PMOS transistor mp6 becomes identical to the power supply VDD.

When the SRAM 1000 is at standby, a standby signal stby2 corresponding to a control signal switched upon standby is outputted from the standby control circuit 500, and the first level shifter circuit 600 having received the input of the standby signal stby2 therein supplies a standby signal stby3 having the first substrate bias potential Vpp higher than the power supply voltage VDD at a High level to the gates of the PMOS transistor mp6 and NMOS transistor mn9 and the PMOS transistor mp8. Further, the inverted signal of the standby signal stby3 is supplied to the gate of the PMOS transistor mp9 via the inverter INV4. As a result, the PMOS transistor mp6 is brought to an off state and the NMOS transistor mn9 is brought to an on state. Since, at this time, the potential of the source of the PMOS transistor mp6 is identical to the power supply voltage VDD, and the potential of the gate thereof is of the potential level of the first substrate bias potential Vpp higher than the power supply voltage VDD, a reverse-bias applied state is held between the gate and source voltages of the PMOS transistor mp6. Therefore, a leak current that flows through the PMOS transistor mp6 placed in the off state can be greatly reduced.

Consequently, the PMOS transistor mp8 that constitutes the fifth switching element SW5 is brought to an off state, and the PMOS transistor mp9 that constitutes the sixth switching element SW6 is brought to an on state. Therefore, the node N2 electrically connected to the substrate for the PMOS transistor mp6 constituting the first switching element SW1 is connected to the first substrate bias potential supply line Vpp and interrupted from the power supply VDD. As a result, the substrate potential of the PMOS transistor mp6 that constitutes the first switching element SW1 becomes identical to the first substrate bias potential Vpp. Since the first substrate bias potential Vpp is higher than the power supply potential VDD, a leak current at the standby of the peripheral circuit 200 is further reduced.

(Advantageous Effects)

According to the twelfth embodiment of the present invention as described above, the substrate potential of the PMOS transistor mp6 constituting the first switching element SW1 and the gate potential thereof are both set higher than the power supply potential VDD at standby. Therefore, the leak current at the standby of the peripheral circuit 200 is further reduced.

At standby, the application of the substrate bias potential to the PMOS transistor mp6 that constitutes the first switching element SW1 makes use of a substrate bias generating circuit 300 for supplying it to the first and second load PMOS transistors mp1 and mp2 of each memory cell. Therefore, there is no need to provide a new bias circuit. Additional current consumption and an increase in area are almost unnecessary. An increase in current consumption and an increase in layout area due to the provision of the level shifter circuit 600, fifth switching element SW5, sixth switching element SW6 and inverter INV4 are so small that they may be ignored. Since the leak current flowing through the PMOS transistor mp6 can be reduced by the substrate control of the PMOS transistor mp6 that constitutes the first switching element SW1, leaks can be reduced even when the gate width of the PMOS transistor mp6 is made larger so as not to influence the speed of the peripheral circuit 200 at its operation.

Thirteenth Preferred Embodiment

Figure 24:
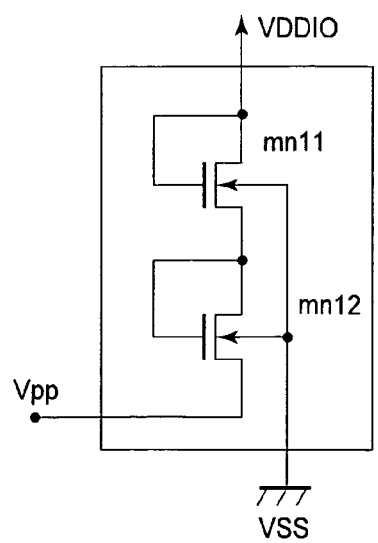
FIG. 24 is an equivalent circuit diagram depicting a configuration of a substrate bias generating circuit according to a thirteenth embodiment of the present invention.

A thirteenth embodiment of the present invention provides a circuit configuration of a substrate bias generating circuit. FIG. 24 is an equivalent circuit diagram showing a configuration of the substrate bias generating circuit according to the thirteenth embodiment of the present invention.

(Circuit Configuration)

The configuration of the substrate bias generating circuit according to the thirteenth embodiment of the present invention makes use of an IO power supply VDDIO supplied as a power supply for an IO buffer without using a charge pump circuit. A voltage stepped down by a series-connected circuit of two diode-connected NMOS transistors mn11 and mn12 from the IO power supply VDDIO higher than an internal power supply is used as a first substrate bias potential Vpp.

(Advantageous Effects)

A first substrate bias potential Vpp is generated by diode-connected MOS transistors using an IO power supply without using a substrate voltage generating circuit comprised of a charge pump circuit. It is therefore possible to reduce an increase in current consumption due to a bias circuit. With the use of the diode-connected MOS transistors, the first substrate bias potential Vpp is susceptible to a process variation, a power supply voltage and temperatures. Since, however, the first substrate bias potential Vpp is supplied only to a substrate for load PMOS transistors of each memory cell, it does not need high accuracy so much unlike a source bias voltage applied to each drive NMOS transistor. Therefore, an influence exerted on SRAM characteristics is small.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor integrated circuit device comprising at least:
   an SRAM memory cell array comprising a plurality memory cells each including load MOS transistors; and
   a substrate bias generating circuit which is electrically connected to the load MOS transistors and supplies a first substrate potential to the load MOS transistors upon at least operation and standby of the SRAM memory cell array in such a manner that absolute values of threshold voltages of the load MOS transistors increase.

2. The semiconductor integrated circuit device according to claim 1, wherein each of the memory cells further includes drive MOS transistor and transfer MOS transistors, and each of the load MOS transistors comprises a PMOS transistor.

3. The semiconductor integrated circuit device according to claim 2, further including a source bias generating circuit which is electrically connected to the drive MOS transistors and which sets a source potential of each of the drive MOS transistors to a ground potential upon the operation and sets the source potential to a first bias potential higher than the ground potential upon the standby.

4. The semiconductor integrated circuit device according to claim 3, wherein the source bias generating circuit comprises a regulator circuit.

5. The semiconductor integrated circuit device according to claim 4, wherein the regulator circuit has an output voltage characteristic having a positive temperature coefficient, in which an output voltage thereof increases with a rise in temperature.

6. The semiconductor integrated circuit device according to claim 4, wherein the regulator circuit has an output voltage characteristic in which an output voltage thereof is proportional to the magnitude of a leak current.

7. The semiconductor integrated circuit device according to claim 1, wherein the substrate bias generating circuit includes:
   a charge pump circuit,
   an oscillator circuit electrically connected to the charge pump circuit, and
   a sensor circuit electrically connected to the charge pump circuit and the oscillator circuit.

8. The semiconductor integrated circuit device according to claim 1, wherein the substrate bias generating circuit generates the first substrate potential using a power supply higher in voltage than an SRAM power supply.

9. The semiconductor integrated circuit device according to claim 1, wherein the substrate bias generating circuit generates the first substrate potential using a voltage stepped down from a power supply higher in voltage than an SRAM power supply.

10. The semiconductor integrated circuit device according to claim 8, wherein the power supply higher than the SRAM power supply in voltage comprises a power supply for an input/output buffer.

11. The semiconductor integrated circuit device according to claim 1, further including:
    a peripheral circuit electrically connected to the memory cells and for obtaining access to the memory cells; and
    a first switch element which is electrically connected to the peripheral circuit and which supplies a power supply voltage to the peripheral circuit upon the operation and unsupplies the power supply voltage to the peripheral circuit at the standby.

12. The semiconductor integrated circuit device according to claim 11, wherein the first switch element is constituted of a PMOS transistor electrically connected between a power supply and the peripheral circuit.

13. The semiconductor integrated circuit device according to claim 12, further including a second switch element which is electrically connected between the PMOS transistor and the substrate bias generating circuit and which supplies the first substrate potential supplied from the substrate bias generating circuit to the load MOS transistors to the PMOS transistor at the standby and unsupplies the first substrate potential to the PMOS transistor upon the operation.

14. The semiconductor integrated circuit device according to claim 11, further including a third switch element which is electrically connected to the peripheral circuit and which supplies a ground voltage to the peripheral circuit at the standby and unsupplies the ground voltage to the peripheral circuit upon the operation.

15. The semiconductor integrated circuit device according to claim 14, wherein the third switch element is constituted of an NMOS transistor electrically connected between ground and the peripheral circuit.

16. The semiconductor integrated circuit device according to claim 12, further including a fourth switch element which is electrically connected to the first switch element and supplies a voltage of an input/output buffer power supply higher in voltage than an SRAM power supply to the first switch element as a control voltage at the standby.

17. The semiconductor integrated circuit device according to claim 1, further including:
    a peripheral circuit electrically connected to the memory cells and for obtaining access to the memory cells; and
    a fifth switch element which is electrically connected to the peripheral circuit and which supplies a power supply voltage to the peripheral circuit upon the operation and unsupplies the power supply voltage to the peripheral circuit at the standby.

18. The semiconductor integrated circuit device according to claim 17, wherein the fifth switch element is constituted of an NMOS transistor electrically connected between ground and the peripheral circuit.

19. The semiconductor integrated circuit device according to claim 17, further including a sixth switch element which is electrically connected to the peripheral circuit and which supplies a power supply voltage to the peripheral circuit at the standby and unsupplies the power supply voltage to the peripheral circuit upon the operation.

20. The semiconductor integrated circuit device according to claim 19, wherein the sixth switch element is constituted of a PMOS transistor electrically connected between a power supply and the peripheral circuit.

21. A leak current reducing method for an SRAM memory cell, comprising the steps of:
    generating a first substrate potential for increasing absolute values of threshold voltages of load MOS transistors included in the SRAM memory cell; and
    supplying the first substrate potential to the load MOS transistors upon at least operation and standby of the SRAM memory cell.

22. The leak current reducing method according to claim 21, further including the steps of:
    setting a source potential of each drive MOS transistor included in the SRAM memory cell to a ground potential upon the operation; and
    setting the source potential to a first bias potential higher than the ground potential.

23. The leak current reducing method according to claim 21, wherein the step for generating the first substrate potential comprises a step for generating the first substrate potential using a power supply higher in voltage than an SRAM power supply.

24. The leak current reducing method according to claim 21, wherein the step for generating the first substrate potential comprises a step for generating the first substrate potential using a voltage stepped down from the power supply higher in voltage than the SRAM power supply.

25. The leak current reducing method according to claim 21, wherein the power supply higher than the SRAM power supply in voltage comprises an input/output buffer power supply.

* * * * *